(12) United States Patent
Kim

(10) Patent No.: US 11,308,998 B2
(45) Date of Patent: Apr. 19, 2022

(54) TIMING DELAY CONTROL CIRCUITS AND ELECTRONIC DEVICES INCLUDING THE TIMING DELAY CONTROL CIRCUITS

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/158,455

(22) Filed: Jan. 26, 2021

(65) Prior Publication Data

US 2022/0059143 A1 Feb. 24, 2022

(30) Foreign Application Priority Data

Aug. 21, 2020 (KR) .......................... 10-2020-0105559

(51) Int. Cl.
*G11C 7/00* (2006.01)
*G11C 7/10* (2006.01)

(52) U.S. Cl.
CPC .................................. *G11C 7/1066* (2013.01)

(58) Field of Classification Search
CPC ....................................................... G11C 7/1066
USPC ........................................................... 365/193
See application file for complete search history.

(56) References Cited

U.S. PATENT DOCUMENTS 7,872,602 B2    1/2011  Chen
2007/0008328 A1*  1/2007  MacWilliams ..... G06F 12/0646
                                                      345/530

FOREIGN PATENT DOCUMENTS

KR      1020090104309 A    10/2009

* cited by examiner

*Primary Examiner* — Hoai V Ho
(74) *Attorney, Agent, or Firm* — William Park & Associates Ltd.

(57) ABSTRACT

An electronic device includes a strobe signal generation circuit and a data output control circuit. The strobe signal generation circuit delays a mode register command by a first predetermined delay period to generate a mode register strobe signal during a mode register read operation. The strobe signal generation circuit adjusts a timing of the mode register strobe signal by detecting variation of timings of first and second variable delay mode register commands, which is generated based on the mode register command, during the mode register read operation. The data output control circuit delays an operation code, which is generated based on the mode register command, by a second predetermined delay period to generate a delayed operation code. The data output control circuit outputs the delayed operation code as data in synchronization with the mode register strobe signal.

20 Claims, 24 Drawing Sheets

FIG. 14

| ISEL<1> | ISEL<2> | ISEL<3> | ISEL<4> | SEL<1> | SEL<2> | SEL<3> | SEL<4> |
|---|---|---|---|---|---|---|---|
| H | L | L | L | H | L | L | L |
| X | H | L | L | L | H | L | L |
| X | X | H | L | L | L | H | L |
| X | X | X | H | L | L | L | H |

TIMING DELAY CONTROL CIRCUITS AND ELECTRONIC DEVICES INCLUDING THE TIMING DELAY CONTROL CIRCUITS

CROSS-REFERENCE TO RELATED APPLICATIONS

The present application claims priority under 35 U.S.C 119(a) to Korean Application No, 10-2020-0105559, filed on Aug. 21, 2020, which is incorporated herein by reference in its entirety.

BACKGROUND

1. Technical Field

Embodiments of the present disclosure relate to timing delay control circuits and electronic devices including the timing delay control circuits.

2. Related Art

Internal circuits included in electronic devices may perform a power gating operation for reducing unnecessary power consumption. The power gating operation may be performed using a zig-zag power gating technique or a header-only power gating technique. While a bias temperature instability (BTI) phenomenon occurs when the internal circuit operates using the zig-zag power gating technique, no BTI phenomenon may occur when the internal circuit operates using the header-only power gating technique. The BTI phenomenon may correspond to a phenomenon that absolute values of threshold voltages of MOS transistors included in the internal circuit increase as the time elapses.

Semiconductor devices among the electronic devices may perform a read operation for outputting data stored in a cell array and a mode register read operation for outputting operation information and internal information stored in a mode register.

SUMMARY

According to an embodiment, an electronic device may include a strobe signal generation circuit and a data output control circuit. The strobe signal generation circuit may be configured to delay a mode register command by a first predetermined delay period to generate a mode register strobe signal during a mode register read operation. In addition, the strobe signal generation circuit may be configured to adjust a timing of the mode register strobe signal by detecting variation of timings of first and second variable delay mode register commands generated based on the mode register command during the mode register read operation. The data output control circuit may be configured to delay an operation code, which is generated based on the mode register command, by a second predetermined delay period to generate a delayed operation code. In addition, the data output control circuit outputs the delayed operation code as data in synchronization with the mode register strobe signal.

According to another embodiment, an electronic device may include a timing detection circuit and a timing adjustment circuit. The timing detection circuit may be configured to delay a mode register command for a mode register read operation based on first and second power gating signals to generate first and second variable delay mode register commands having variable delay periods and a fixed delay mode register command having a fixed delay period. In addition, the timing detection circuit may be configured to compare the variable delay periods of the first and second variable delay mode register commands with the fixed delay period of the fixed delay mode register command to generate first and second selection signals. The timing adjustment circuit may be configured to delay the second variable delay mode register command based on the first and second selection signals to generate a mode register strobe signal for the mode register read operation.

BRIEF DESCRIPTION OF THE DRAWINGS

FIG. 14 is a table illustrating an operation of the internal selection signal generation circuit illustrated in FIG. 13.

DETAILED DESCRIPTION

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter with reference to the accompanying drawings. However, the embodiments described herein are for illustrative purposes only and are not intended to limit the scope of the present disclosure.

Figure 1:
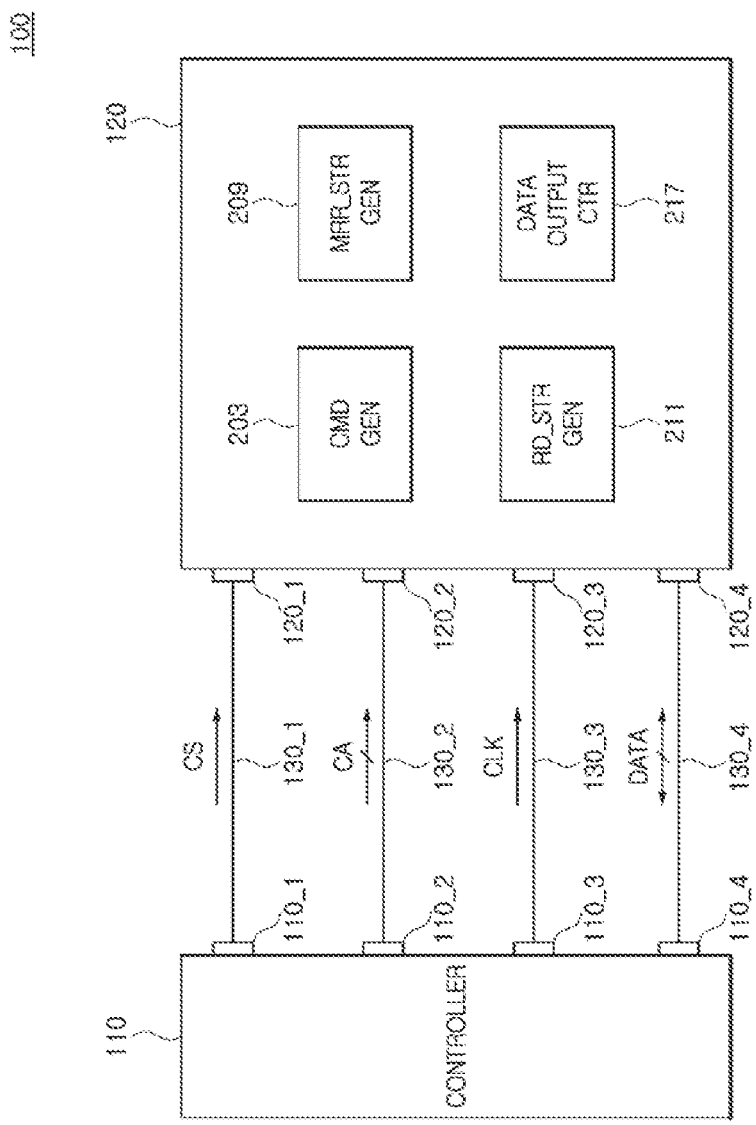
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120.

The controller 110 may include a first control pin 110_2, a second control pin 110_2, a third control pin 110_3, and a fourth control pin 110_4. The electronic device 120 may include a first device pin 120_1, a second device pin 120_2, a third device pin 120_3, and a fourth device pin 120_4. The controller 110 may transmit a chip selection signal CS to the electronic device 120 through a first transmission line 130_1 connecting the first control pin 110_1 and the first device pin 120_1 to each other. The controller 110 may transmit a command/address signal CA to the electronic device 120 through a second transmission line 130_2 connecting the second control pin 110_2 and the second device pin 120_2 to each other. The controller 110 may transmit a clock signal CLK to the electronic device 120 through a third transmission line 130_3 connecting the third control pin 110_3 and the third device pin 120_3 to each other. The controller 110 may transmit data DATA to the electronic device 120 through a fourth transmission line 130_4 connecting the fourth control pin 110_4 and the fourth device pin 120_4 to each other. The controller 110 may receive the data DATA from the electronic device 120 through the fourth transmission line 130_4 connecting the fourth control pin 110_4 and the fourth device pin 120_4 to each other.

The electronic device 120 may include a command generation circuit (CMD_GEN) 203, a first strobe signal generation circuit (MRR_STR_GEN) 209, a second strobe signal generation circuit (RD_STR_GEN) 211, and a data output control circuit (DATA_OUTPUT_CTR) 217. The electronic device 120 may be realized using a semiconductor device. The electronic device 120 may receive the chip selection signal CS, the command/address signal CA, the clock signal CLK, and the data DATA from the controller 110 to perform various internal operations including a mode register read operation and a read operation.

The electronic device 120 may include the command generation circuit 203 that generates a mode register command (MRR of FIG. 2) for the mode register read operation and a read command (RD of FIG. 2) for the read operation based on the chip selection signal CS and the command/address signal CA.

Figure 7:
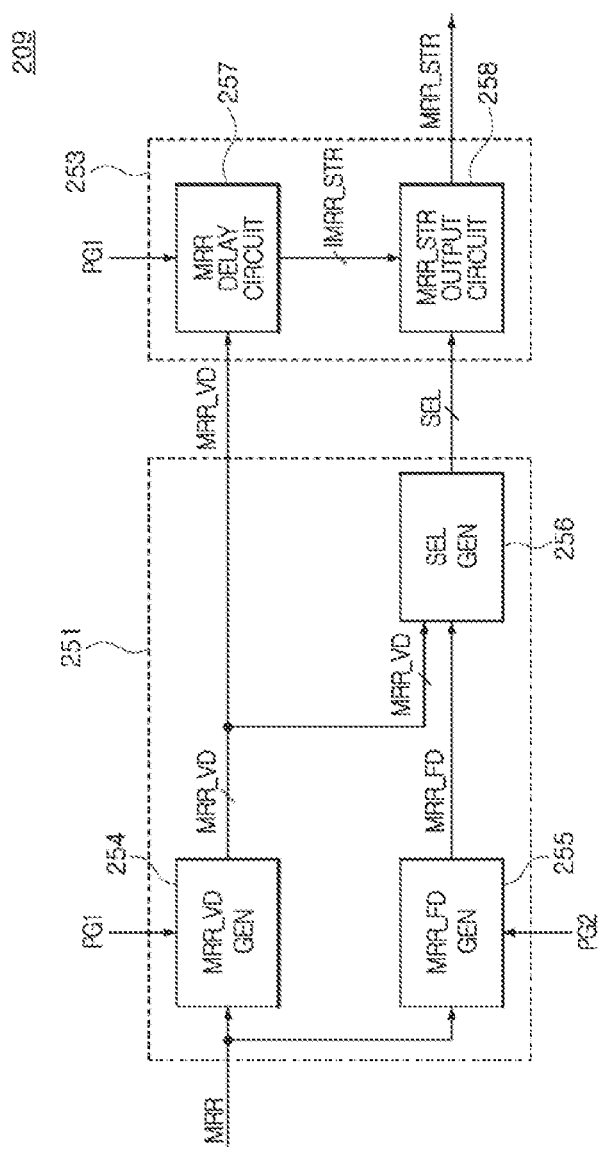
FIG. 7 is a block diagram illustrating a configuration of a first strobe signal generation circuit included in the electronic device illustrated in FIG. 2.

The electronic device 120 may include the first strobe signal generation circuit 209 that generates a mode register strobe signal (MRR_STR of FIG. 2) by delaying the mode register command (MRR of FIG. 2) by a first predetermined delay period and that adjusts a timing of the mode register strobe signal (MRR_STR of FIG. 2) by detecting variation of a timing of a variable delay mode register command (MRR_VD of FIG. 7). Thus, the electronic device 120 may compensate for a delay time, which is varied by the BTI phenomenon, in real time whenever the mode register read operation is performed.

Figure 18:
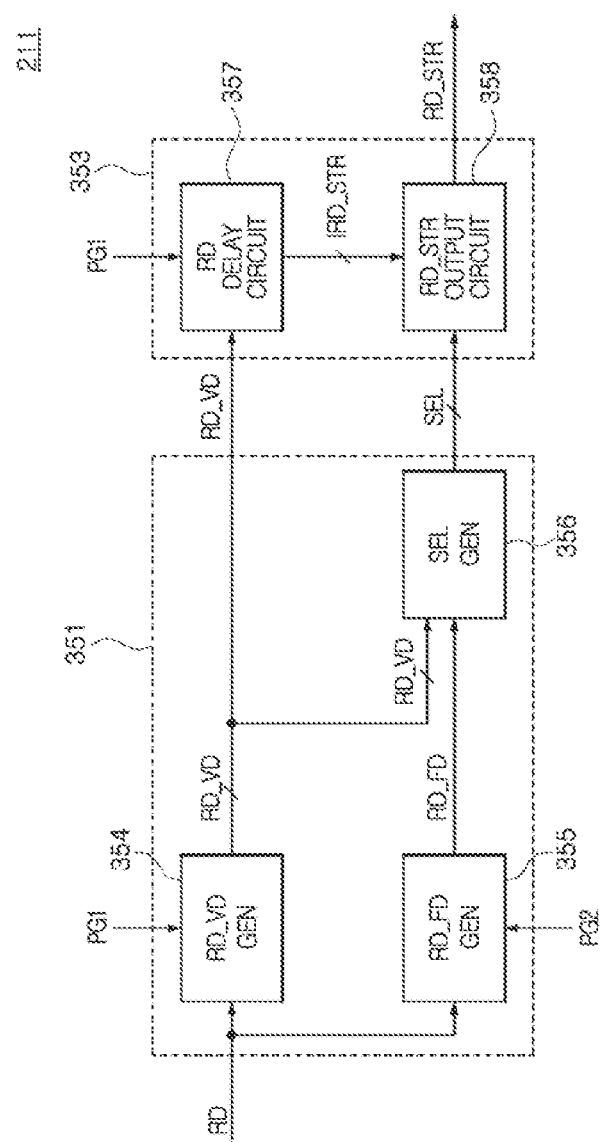
FIG. 18 is a block diagram illustrating a configuration of a second strobe signal generation circuit included in the electronic device illustrated in FIG. 2.

The electronic device 120 may include the second strobe signal generation circuit 211 that generates a read strobe signal (RD_STR of FIG. 2) by delaying the read command (RD of FIG. 2) by a third predetermined delay period and that adjusts a timing of the read strobe signal (RD_STR of FIG. 2) by detecting variation of a timing of a variable delay read command (RD_VD of FIG. 18). Thus, the electronic device 120 may compensate for a delay time, which is varied by the BTI phenomenon, in real time whenever the read operation is performed.

The electronic device 120 may include the output control circuit 217 that outputs a delayed operation code (OP_d of FIG. 19), which is obtained by delaying an operation code (OP of FIG. 2) by a second predetermined delay period in synchronization with the mode register strobe signal (MRR_STR of FIG. 2), as the data DATA when the mode register read operation is performed. The electronic device 120 may include the output control circuit 217 that outputs delayed read data (RD_DATAd of FIG. 19), which are obtained by delaying read data (RD_DATA of FIG. 2) by a fourth predetermined delay period in synchronization with the read strobe signal (RD_STR of FIG. 2), as the data DATA when the read operation is performed.

Figure 2:
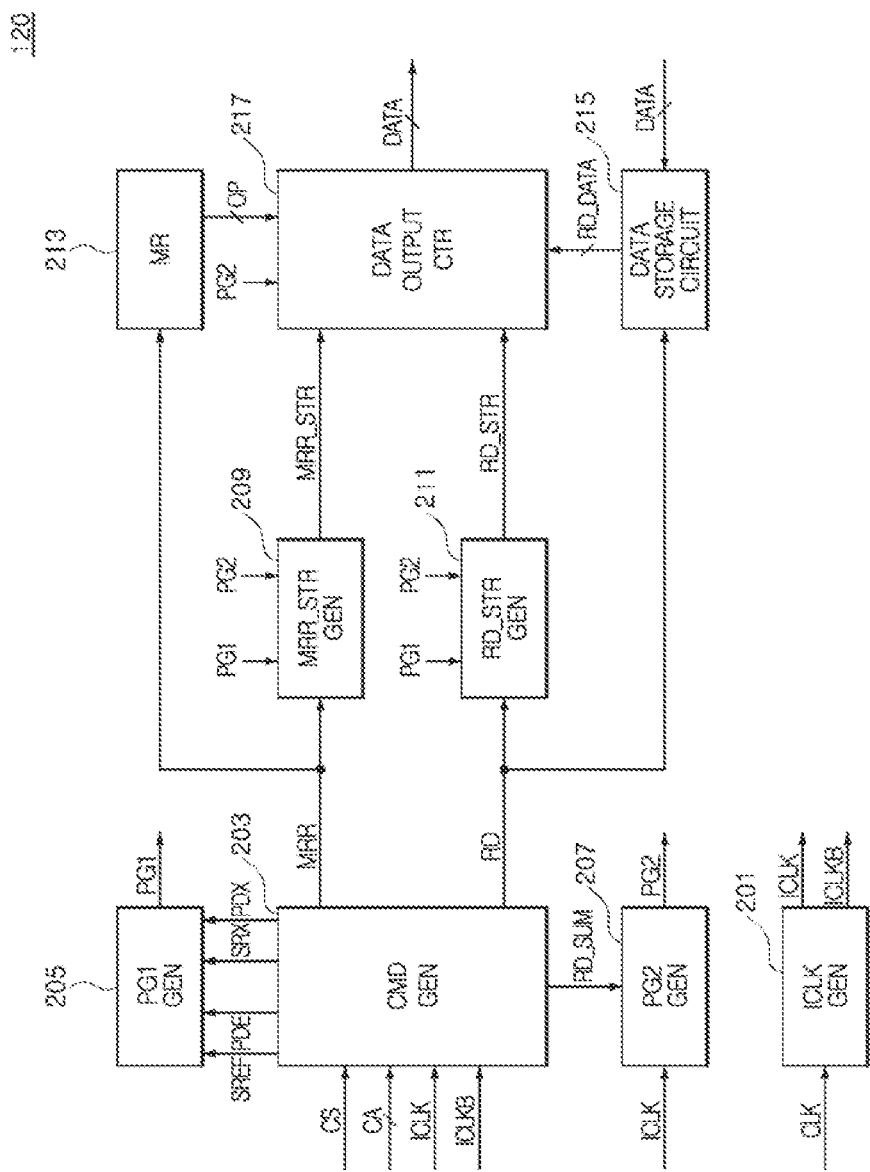
FIG. 2 is a block diagram illustrating a configuration of an electronic device included in the electronic system illustrated in FIG.

FIG. 2 is a block diagram illustrating the electronic device 120 included in the electronic system 100 illustrated in FIG. 1. As illustrated in FIG. 2, the electronic device 120 may include an internal clock generation circuit (ICLK_GEN) 201, the command generation circuit 203, a first power gating signal generation circuit (PG1_GEN) 205, a second power gating signal generation circuit (PG2_GEN) 207, the first strobe signal generation circuit 209, the second strobe signal generation circuit 211, a mode register (MR) 213, a data storage circuit 215, and the data output control circuit 217.

The internal clock generation circuit 201 may generate the internal clock signal ICLK and an inverted internal clock signal ICLKB based on the clock signal CLK. The internal clock signal ICLK may be generated to have the same phase as the clock signal CLK. The inverted internal clock signal ICLKB may be generated to have an opposite phase to the clock signal CLK. The phases of the internal clock signal ICLK and the inverted internal clock signal ICLKB may be set to be different according to the embodiment. A frequency of the internal clock signal ICLK and the inverted internal clock signal ICLKB may also be set to be different according to the embodiment. An operation of the internal clock generation circuit 201 for generating the internal clock signal ICLK and the inverted internal clock signal ICLKB will be described with reference to FIG. 3 later.

The command generation circuit 203 may be synchronized with the internal clock signal ICLK and the inverted internal clock signal ICLKB to generate the mode register command MRR, the read command RD, a synthesis read command RD_SUM, a self-refresh command SREF, a self-refresh exit command SRX, a power-down command PDE, and a power-down exit command PDX based on the chip selection signal CS and the command/address signal CA. The command generation circuit 203 may generate the mode register command MRR based on the chip selection signal CS and the command/address signal CA for performing the mode register read operation. The mode register command MRR may be enabled to output the operation code OP stored in the mode register 213 when the mode register read operation is performed. The command generation circuit 203 may generate the read command RD based on the chip selection signal CS and the command/address signal CA for performing the read operation. The read command RD may be enabled to output the read data RD_DATA stored in the data storage circuit 215 when the read operation is performed. The command generation circuit 203 may generate the synthesis read command RD_SUM based on the chip selection signal CS and the command/address signal CA for performing the mode register read operation or the read operation. The synthesis read command RD_SUM may be enabled to enable a second power gating signal PG2 for performing a second power gating operation when the mode register read operation or the read operation is performed. The command generation circuit 203 may generate the self-refresh command SREF based on the chip selection signal CS and the command/address signal CA having a logic level combination for performing a self-refresh operation. The self-refresh command SREF may be enabled to enable a first power gating signal PG1 for performing a first power gating operation when the self-refresh operation is performed. The command generation circuit 203 may generate the self-refresh exit command SRX based on the chip selection signal CS and the command/address signal CA having a logic level combination for terminating the self-refresh operation. The self-refresh exit command SRX may be enabled to disable the first power gating signal PG1 for performing the first power gating operation when the self-refresh operation terminates. The command generation circuit 203 may generate the power-down command PDE based on the chip selection signal CS and the command/address signal CA having a logic level combination for activating a power-down mode. The power-down command PDE may be enabled to enable the first power gating signal PG1 for performing the first power gating operation when the power-down mode is activated. The command generation circuit 203 may generate the power-down exit command PDX based on the chip selection signal CS and the command/address signal CA having a logic level combination for terminating the power-down mode. The power-down exit command PDX may be enabled to disable the first power gating signal PG1 for performing the first power gating operation when the power-down mode terminates. The number of bits included in the command/address signal CA may be set to be different according to the embodiments. An operation and a configuration of the command generation circuit 203 will be described with reference to FIG. 4 later.

The first power gating signal generation circuit 205 may generate the first power gating signal PG1 based on the self-refresh command SREF, the self-refresh exit command SRX, the power-down command PDE, and the power-down exit command PDX. The first power gating signal PG1 may be enabled to perform the first power gating operation for interrupting the supply of a first power source voltage VDD and a first ground voltage VSS when the self-refresh operation or a power-down operation is performed. The first power source voltage VDD and the first ground voltage VSS may be provided through power pads (not shown). The first power gating signal PG1 may be disabled when the self-refresh operation or the power-down operation terminates. The first power gating signal generation circuit 205 may enable the first power gating signal PG1 when the self-refresh command SREF or the power-down command PDE is enabled. The first power gating signal generation circuit 205 may disable the first power gating signal PG1 when the self-refresh exit command SRX or the power-down exit command PDX is enabled. An operation and a configuration of the first power gating signal generation circuit 205 will be described with reference to FIG. 5 later.

The second power gating signal generation circuit 207 may be synchronized with the internal clock signal ICLK to generate the second power gating signal PG2 based on the synthesis read command RD_SUM. The second power gating signal PG2 may be enabled to perform the second power gating operation for interrupting the supply of the first power source voltage VDD when the synthesis read command RD_SUM is disabled. The second power gating signal PG2 may be disabled during a read latency period when the read operation or the mode register read operation is performed. An operation and a configuration of the second power gating signal generation circuit 207 will be described with reference to FIG. 6 later.

The first strobe signal generation circuit 209 may delay the mode register command MRR by the first predetermined delay period based on the first and second power gating signals PG1 and PG2 to generate the mode register strobe signal MRR_STR. The first strobe signal generation circuit 209 may generate the mode register strobe signal MRR_STR by delaying the mode register command MRR by the first predetermined delay period when the mode register read operation is performed and may adjust a timing of the mode register strobe signal MRR_STR by detecting variation of a timing of the variable delay mode register command (MRR_VD of FIG. 7). The first predetermined delay period may increase in proportion to a period that the first power gating operation interrupting the supply of the first power source voltage VDD and the first ground voltage VSS is performed. The mode register strobe signal MRR_STR may be enabled to output the delayed operation code (OP_d of FIG. 19), which is obtained by delaying the operation code OP by the second predetermined delay period, as the data DATA when the mode register read operation is performed. The second predetermined delay period may be fixed regardless of a period that the second power gating operation interrupting the supply of the first power source voltage VDD is performed.

The first strobe signal generation circuit 209 may adjust a timing of the mode register strobe signal MRR_STR by detecting variation of timings of the plurality of variable delay mode register commands (MRR_VD of FIG. 7). The first strobe signal generation circuit 209 may delay the mode register command MRR to generate the plurality of variable delay mode register commands (MRR_VD of FIG. 7) and a fixed delay mode register command (MRR_FD of FIG. 7). The first strobe signal generation circuit 209 may delay the variable delay mode register command (MRR_VD of FIG. 7) to generate a plurality of internal mode register strobe signals (IMRR_STR of FIG. 7). The first strobe signal generation circuit 209 may compare delay periods of the plurality of variable delay mode register commands (MRR_VD of FIG. 7) with a delay period of the fixed delay mode register command (MRR_FD of FIG. 7) to detect variation of the timings of the plurality of variable delay mode register commands (MRR_VD of FIG. 7). The first strobe signal generation circuit 209 may output one of the plurality of internal mode register strobe signals (IMRR_STR of FIG. 7) as the mode register strobe signal MRR_STR according to a detection result of the variation of the timings of the plurality of variable delay mode register commands (MRR_VD of FIG. 7), thereby adjusting a timing of the mode register strobe signal MRR_STR. Thus, the first strobe signal generation circuit 209 may compensate for a delay period, which is varied by the BTI phenomenon, in real time whenever the mode register read operation is performed. An operation and a configuration of the first strobe signal generation circuit 209 will be described with reference to FIG. 7 later.

The second strobe signal generation circuit 211 may receive the first power gating signal PG1 and the second power gating signal PG2 to generate the read strobe signal RD_STR from the read signal RD. The second strobe signal generation circuit 211 may generate the read strobe signal RD_STR by delaying the read command RD by the third predetermined delay period when the read operation is performed and may adjust a timing of the read strobe signal RD_STR by detecting variation of the timings of the plurality of variable delay read commands (RD_VD of FIG. 18) generated based on the read command RD. The third predetermined delay period may increase in proportion to a period that the first power gating operation interrupting the supply of the first power source voltage VDD and the first ground voltage VSS is performed. The read strobe signal RD_STR may be enabled to output the delayed read data (RD_DATAd of FIG. 19), which is obtained by delaying the read data RD_DATA by the fourth predetermined delay period, as the data DATA when the read operation is performed. The fourth predetermined delay period may be fixed regardless of a period that the second power gating operation interrupting the supply of the first power source voltage VDD is performed.

The second strobe signal generation circuit 211 may adjust a timing of the read strobe signal RD_STR by detecting variation of timings of the plurality of variable delay read command (RD_VD of FIG. 18). The second strobe signal generation circuit 211 may delay the rea command RD to generate the plurality of variable delay read commands (RD_VD of FIG. 18) and a fixed delay read command (RD_FD of FIG. 18). The second strobe signal generation circuit 211 may delay the variable delay read command (RD_VD of FIG. 18) to generate a plurality of internal read strobe signals (IRD_STR of FIG. 18). The second strobe signal generation circuit 211 may compare delay periods of the plurality of variable delay read commands (RD_VD of FIG. 18) with a delay period of the fixed delay read command (RD_FD of FIG. 18) to detect variation of the timings of the plurality of variable delay read commands (RD_VD of FIG. 18). The second strobe signal generation circuit 211 may output one of the plurality of internal read strobe signals (IRD_STR of FIG. 18) as the read strobe signal RD_STR according to a detection result of the variation of the timings of the plurality of variable delay read commands (RD_VD of FIG. 18), thereby adjusting a timing of the read strobe signal RD_STR. Thus, the second strobe signal generation circuit 211 may compensate for a delay period, which is varied by the BTI phenomenon, in real time whenever the read operation is performed. An operation and a configuration of the second strobe signal generation circuit 211 will be described with reference to FIG. 18 later.

The mode register 213 may receive the mode register command MRR to output the operation code OP stored in the mode register 213. The operation code OP may include operation information and internal information about the electronic device 120. The number of bits included in the operation code OP may be set to be different according to the embodiments.

The data storage circuit 215 may receive the read command RD to output the data DATA stored in a cell array (not shown) as the read data RD_DATA. The number of bits included in each of the data DATA and the read data RD_DATA may be set to be different according to the embodiments.

Figure 3:
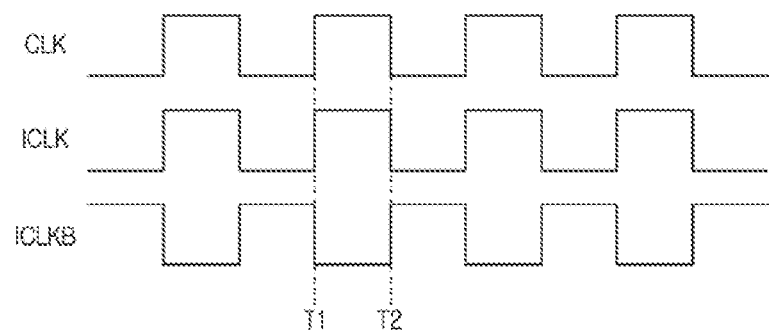
FIG. 3 is a timing diagram illustrating an operation of an internal dock generation circuit included in the electronic device illustrated in FIG. 2.

The data output control circuit 217 may output one of the operation code OP and the read data RD_DATA as the data DATA based on the second power gating signal PG2, the mode register strobe signal MRR_STR, and the read strobe signal RD_STR. The data output control circuit 217 may generate the delayed operation code (OP_d of FIG. 19) by delaying the operation code OP, which is generated based on the mode register command MRR, by the second predetermined delay period when the mode register read operation is performed. The second predetermined delay period may be fixed regardless of a period that the second power gating operation interrupting the supply of the first power source voltage VDD is performed. The data output control circuit 217 may be synchronized with the mode register strobe signal MRR_STR to output the delayed operation code (OP_d of FIG. 19) as the data DATA when the mode register read operation is performed. The data output control circuit 217 may generate the delayed read data (RD_DATAd of FIG. 19) by delaying the read data RD_DATA, which is generated based on the read command RD, by the fourth predetermined delay period when the read operation is performed. The fourth predetermined delay period may be fixed regardless of a period that the second power gating operation interrupting the supply of the first power source voltage VDD is performed. The data output control circuit 217 may be synchronized with the read strobe signal RD_STR to output the delayed read data (RD_DATAd of FIG. 19) as the data DATA when the read operation is performed. An operation and a configuration of the data output control circuit 217 will be described with reference to FIG. 19 later, FIG. 3 is a timing diagram illustrating an operation of the internal clock generation circuit 201. Referring to FIG. 3, the internal clock generation circuit 201 may generate the internal clock signal ICLK having the same phase as the dock signal CLK. The internal dock generation circuit 201 may be synchronized with a rising edge of the dock signal CLK at a point in time "T1" to generate the internal dock signal ICLK which is toggled from a logic "low" level into a logic "high" level. The internal dock generation circuit 201 may generate the inverted internal dock signal ICLKB having an opposite phase to the clock signal CLK. The internal dock generation circuit 201 may be synchronized with a falling edge of the clock signal CLK at a point in time "T2" to generate the inverted internal clock signal ICLKB which is toggled from a logic "high" level into a logic "low" level.

Figure 4:
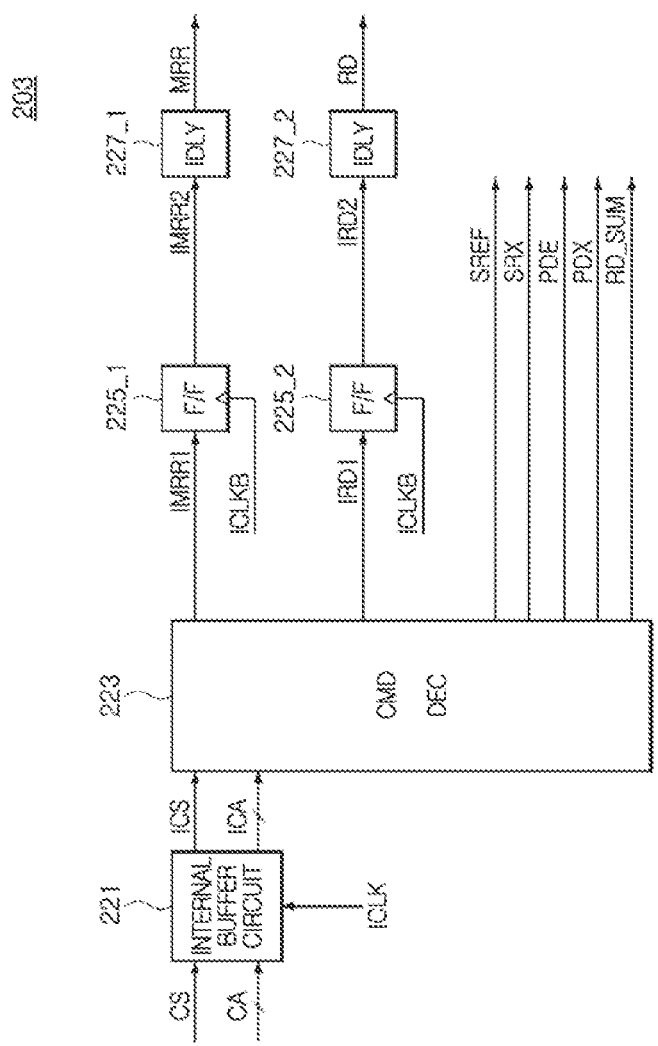
FIG. 4 illustrates a configuration of a command generation circuit included in the electronic device illustrated in FIG. 2.

FIG. 4 illustrates a configuration of the command generation circuit 203 included in the electronic device 120. As illustrated in FIG. 4, the command generation circuit 203 may include an internal buffer circuit 221, a command decoder 223, a plurality of flip-flops 225_1 and 225_2, and a plurality of internal delay circuits 227_1 and 227_2.

The internal buffer circuit 221 may be synchronized with the internal clock signal ICLK to generate an internal chip selection signal ICS from the chip selection signal CS. The internal buffer circuit 221 may be synchronized with the internal clock signal ICLK to generate an internal command/address signal ICA from the command/address signal CA. The number of bits included in the internal command/address signal ICA may be set to be different according to the embodiments.

The command decoder 223 may decode the internal chip selection signal ICS and the internal command/address signal ICA to generate a first internal mode register command IMRR1, a first internal read command IRD1, the synthesis read command RD_SUM, the self-refresh command SREF, the self-refresh exit command SRX, the power-down command PDE, and the power-down exit command PDX. The first internal mode register command IMRR1 may be generated from the internal chip selection signal ICS and the internal command/address signal ICA having a logic level combination for performing the mode register read operation. The first internal read command IRD1 may be generated from the internal chip selection signal ICS and the internal command/address signal ICA having a logic level combination for performing the read operation. The synthesis read command RD_SUM may be generated from the internal chip selection signal KS and the internal command/address signal ICA having a logic level combination for performing the mode register read operation or the read operation. The self-refresh command SREF may be generated from the internal chip selection signal ICS and the internal command/address signal ICA having a logic level combination for performing the refresh operation. The self-refresh exit command SRX may be generated from the internal chip selection signal ICS and the internal command/address signal ICA having a logic level combination for terminating the refresh operation. The power-down command PDE may be generated from the internal chip selection signal ICS and the internal command/address signal ICA having a logic level combination for performing the power-down operation. The power-down exit command PDX may be generated from the internal chip selection signal ICS and the internal command/address signal ICA having a logic level combination for terminating the power-down operation.

The flip-flop 225_1 may be synchronized with the inverted internal clock signal ICLKB to latch the first internal mode register command IMRR1 and to output the latched signal of the first internal mode register command IMRR1 as a second internal mode register command IMRR2. The flip-flop 225_2 may be synchronized with the inverted internal clock signal ICLKB to latch the first internal read command IRD1 and to output the latched signal of the first internal read command IRD1 as a second internal read command IRD2.

The internal delay circuit 227_1 may delay the second internal mode register command IMRR2 by a certain delay period to generate the mode register command MRR for controlling the output of the operation code OP when the mode register read operation is performed. The internal delay circuit 227_2 may delay the second internal read command IRD2 by a certain delay period to generate the read command RD for controlling the output of the read data RD_DATA when the read operation is performed.

Figure 5:
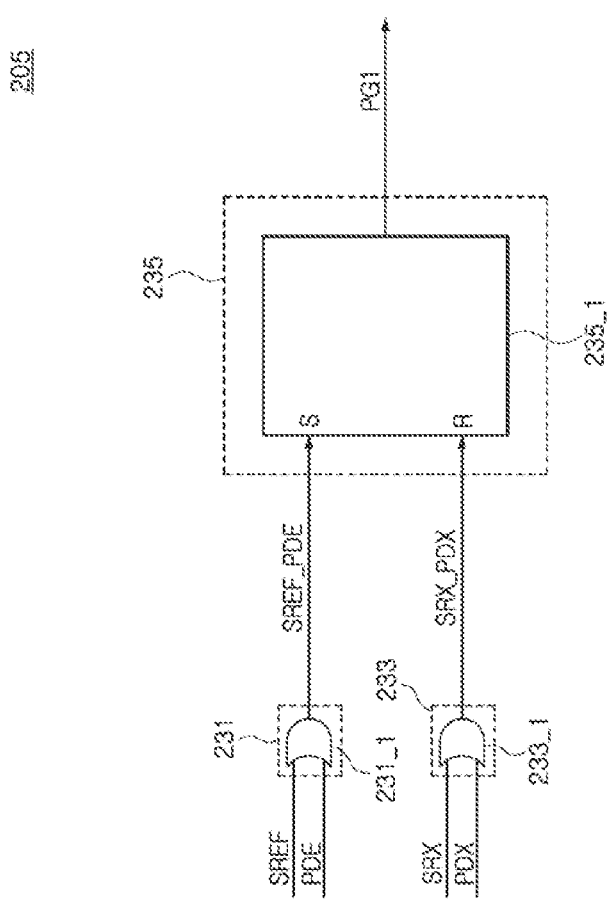
FIG. 5 is a circuit diagram illustrating a configuration of a first power gating signal generation circuit included in the electronic device illustrated in FIG. 2.

FIG. 5 is a circuit diagram illustrating a configuration of the first power gating signal generation circuit 205 included in the electronic device 120. As illustrated in FIG. 5, the first power gating signal generation circuit 205 may include a power-down entry signal generation circuit 231, a power-down exit signal generation circuit 233, and a first power gating signal output circuit 235.

The power-down entry signal generation circuit 231 may generate a power-down entry signal SREF_PDE based on the self-refresh command SREF and the power-down command PDE. The power-down entry signal generation circuit 231 may enable the power-down entry signal SREF_PDE when the self-refresh command SREF or the power-down command PDE is enabled. The power-down entry signal generation circuit 231 may be designed to include an OR gate 231_1. The OR gate 231_1 may perform a logical OR operation of the self-refresh command SREF and the power-down command PDE to generate the power-down entry signal SREF_PDE.

The power-down exit signal generation circuit 233 may generate a power-down exit signal SRX_PDX based on the self-refresh exit command SRX and the power-down exit command PDX. The power-down exit signal generation circuit 233 may enable the power-down exit signal SRX_PDX when the self-refresh exit command SRX or the power-down exit command PDX is enabled. The power-down exit signal generation circuit 233 may be designed to include an OR gate 233_1. The OR gate 233_1 may perform a logical OR operation of the self-refresh exit command SRX and the power-down exit command PDX to generate the power-down exit signal SRX_PDX.

The first power gating signal output circuit 235 may generate the first power gating signal PG1 based on the power-down entry signal SREF_PDE and the power-down exit signal SRX_PDX. The first power gating signal output circuit 235 may enable the first power gating signal PG1 when the power-down entry signal SREF_PDE is enabled. The first power gating signal output circuit 235 may disable the first power gating signal PG1 when the power-down exit signal SRX_PDX is enabled. The first power gating signal output circuit 235 may be designed to include an S-R latch 235_1. The S-R latch 235_1 may generate the first power gating signal PG1 which is enabled to have a logic "high" level when the power-down entry signal SREF_PDE is enabled to have a logic "high" level and which is disabled to have a logic "low" level when the power-down exit signal SRX_PDX is enabled to have a logic "high" level.

Figure 6:
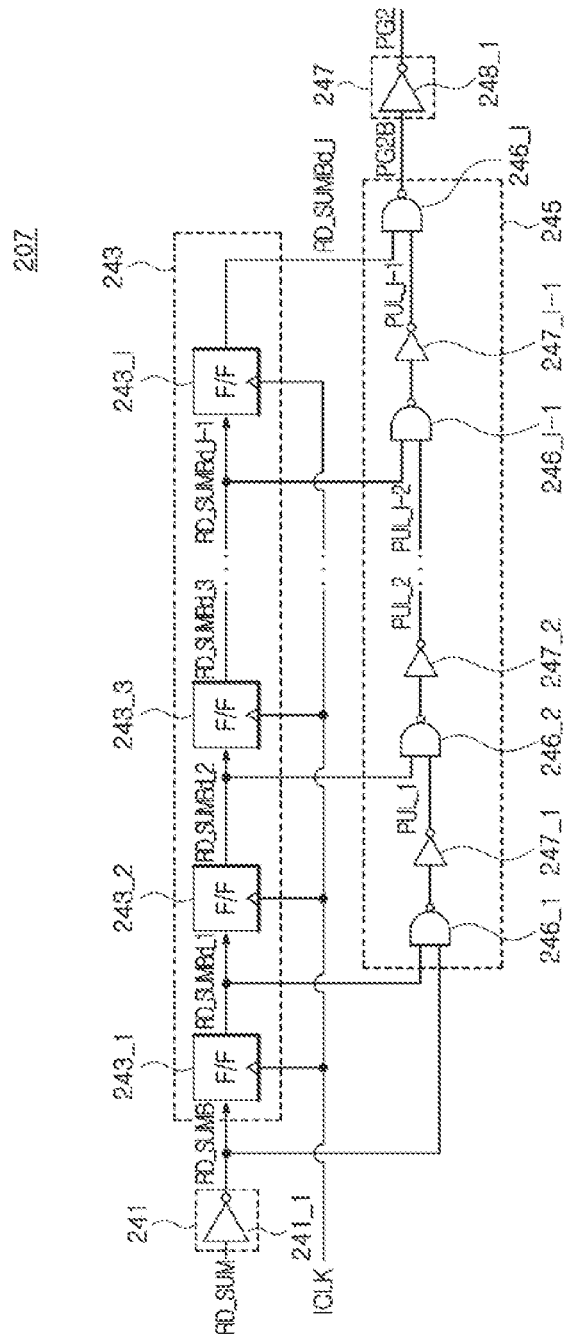
FIG. 6 is a circuit diagram illustrating a configuration of a second power gating signal generation circuit included in the electronic device illustrated in FIG. 2.

FIG. 6 is a circuit diagram illustrating a configuration of the second power gating signal generation circuit 207 included in the electronic device 120. As illustrated in FIG. 6, the second power gating signal generation circuit 207 may include a synthesis read command inversion circuit 241, a read latency shift circuit 243, a pulse synthesis circuit 245, and a second power gating signal output circuit 247.

The synthesis read command inversion circuit 241 may invert a level of the synthesis read command RD_SUM to generate an inverted synthesis read command RD_SUMB. The inverted synthesis read command RD_SUMB may be enabled to have a logic "low" level when the read operation or the mode register read operation is enabled. The synthesis read command inversion circuit 241 may be designed to include an inverter 241_1. The inverter 241_1 may inversely buffer the synthesis read command RD_SUM to generate the inverted synthesis read command RD_SUMB.

The read latency shift circuit 243 may delay the inverted synthesis read command RD_SUMB by a read latency period in synchronization with the internal dock signal ICLK to generate a latency read signal RD_SUMBd_I. The read latency shift circuit 243 may include a plurality of flip-flops 243_1~243_I (where, "I" is set to be a natural number which is equal to or greater than four). The flip-flop 243_1 may delay the inverted synthesis read command RD_SUMB by one cycle of the internal clock signal ICLK in synchronization with a rising edge of the internal clock signal ICLK to generate a first delayed inversion signal RD_SUMBd_1. The flip-flop 243_2 may delay the first delayed inversion signal RD_SUMBd_1 by one cycle of the internal clock signal ICLK in synchronization with a rising edge of the internal clock signal ICLK to generate a second delayed inversion signal RD_SUMBd_2. The flip-flop 243_3 may delay the second delayed inversion signal RD_SUMBd_2 by one cycle of the internal dock signal ICLK in synchronization with a rising edge of the internal dock signal ICLK to generate a third delayed inversion signal RD_SUMBd_3. The flip-flop 243_I may delay an $(I-1)^{th}$ delayed inversion signal RD_SUMBd_I-1 by one cycle of the internal clock signal ICLK in synchronization with a rising edge of the internal clock signal ICLK to generate the latency read signal RD_SUMBd_I. The latency read signal RD_SUMBd_I may be generated by delaying the inverted synthesis read command RD_SUMB by the read latency period.

The pulse synthesis circuit 245 may synthesize the all of the inverted synthesis read command RD_SUMB, the plurality of delayed inversion signals RD_SUMBd_1~RD_SUMBd_I-1, and the latency read signal RD_SUMBd_I to generate a second inverted power gating signal PG2B. The pulse synthesis circuit 245 may include NAND gates 246_1~246_I and inverters 247_1~247_I-1. The NAND gate 246_1 may receive the inverted synthesis read command RD_SUMB and the first delayed inversion signal RD_SUMBd_1 to perform a logical NAND operation of the inverted synthesis read command RD_SUMB and the first delayed inversion signal RD_SUMBd_1. The inverter 247_1 may inversely buffer an output signal of the NAND gate 246_1 to generate a first read pulse PUL_1. The NAND gate 246_2 may receive the second delayed inversion signal RD_SUMBd_2 and the first read pulse PUL_1 to perform a logical NAND operation of the second delayed inversion signal RD_SUMBd_2 and the first read pulse PUL_1. The inverter 247_2 may inversely buffer an output signal of the NAND gate 246_2 to generate a second read pulse PUL_2. The NAND gate 246_I-1 may receive the $(I-1)^{th}$ delayed inversion signal RD_SUMBd_I-1 and an $(I-2)^{th}$ read pulse PUL_I-2 to perform a logical NAND operation of the $(I-1)^{th}$ delayed inversion signal RD_SUMBd_I-1 and the $(I-2)^{th}$ read pulse PUL_I-2. The inverter 247_I-1 may inversely buffer an output signal of the NAND gate 246_I-1 to generate an $(I-1)^{th}$ read pulse PUL_I-1. The NAND gate 246_I may perform a logical NAND operation of the latency read signal RD_SUMBd_I and the $(I-1)^{th}$ read pulse PUL_I-1 to generate and output the second inverted power gating signal PG2B. The second inverted power gating signal PG2B may be enabled during the read latency period when the read operation or the mode register read operation is performed.

The second power gating signal output circuit 247 may invert the second inverted power gating signal PG2B to generate the second power gating signal PG2. The second power gating signal PG2 may be disabled to have a logic "low" level during the read latency period when the read operation or the mode register read operation is performed. The second power gating signal output circuit 247 may be designed to include an inverter 248_1. The inverter 248_1 may inversely buffer the second inverted power gating signal PG2B to generate the second power gating signal PG2.

FIG. 7 is a block diagram illustrating a configuration of the first strobe signal generation circuit 209 included in the electronic device 120. As illustrated in FIG. 7, the first strobe signal generation circuit 209 may include a first timing detection circuit 251 and a first timing adjustment circuit 253.

The first timing detection circuit 251 may include a first variable delay command generation circuit (MRR_VD_GEN) 254, a first fixed delay command generation circuit (MRR_FD_GEN) 255, and a first selection signal generation circuit (SEL_GEN) 256. The first timing detection circuit 251 may generate the variable delay mode register command MRR_VD and a plurality of selection signals SEL based on the first power gating signal PG1, the second power gating signal PG2, and the mode register command MRR.

The first timing detection circuit 251 may delay the mode register command MRR based on the first power gating signal PG1 and the second power gating signal PG2 to generate the plurality of variable delay mode register commands MRR_VD having variable delay periods and the fixed delay mode register command MRR_FD having a fixed delay period. The first timing detection circuit 251 may delay the mode register command MRR based on the first power gating signal PG1 to sequentially generate the plurality of variable delay mode register commands MRR_VD. The first timing detection circuit 251 may delay the mode register command MRR based on the first power gating signal PG1 to sequentially generate the plurality of variable delay mode register commands MRR_VD (e.g., first to fourth variable delay mode register commands MRR_VD<1:4> of FIG. 8). The first to fourth variable delay mode register commands MRR_VD<1:4> may have delay periods that sequentially increase in proportion to a period that the first power gating operation for interrupting the supply of the first power source voltage VDD and the first ground voltage VSS is performed. Enabled periods of the plurality of variable delay mode register commands MRR_VD may overlap with each other. For example, enabled periods of the first and second variable delay mode register commands MRR_VD<1:2> may partially overlap with each other, and enabled periods of the second and third variable delay mode register commands MRR_VD<2:3> may partially overlap with each other. In addition, enabled periods of the third and fourth variable delay mode register commands MRR_VD<3:4> may also partially overlap with each other. The first timing detection circuit 251 may delay the mode register command MRR based on the second power gating signal PG2 to generate the fixed delay mode register command MRR_FD. The fixed delay mode register command MRR_FD may have a fixed delay period regardless of a period that the second power gating operation for interrupting the supply of the first power source voltage VDD is performed. The fixed delay mode register command MRR_FD may be enabled in a period that at least one of the plurality of variable delay mode register commands MRR_VD is enabled. For example, the fixed delay mode register command MRR_FD may be enabled at a moment in a period from a point in time when the first variable delay mode register command MRR_VD<1> is enabled until a point in time when the fourth variable delay mode register command MRR_VD<4> is enabled.

In an embodiment, the first timing detection circuit 251 may detect variation in the timings of variable delay mode register commands MRR_VD. For example, to detect the variation in the timings of the variable delay mode register commands MRR_VD, the first timing detection circuit 251 may compare the delay periods of the plurality of variable delay mode register commands MRR_VD with a delay period of the fixed delay mode register command MRR_FD to generate the plurality of selection signals SEL. The selection signals SEL may then be used by the first strobe signal output circuit 258 to select one of a plurality of internal mode register strobe signals IMRR_STR to output as the mode register strobe signal MRR_STR. The plurality of internal mode register strobe signals IMRR_STR are generated, sequentially, by delaying the variable delay mode register command MRR_VD by an internal predetermined delay period based on the first power gating signal PG1. Thus, by selecting one of the plurality of internal mode register strove signals IMRR_STR to output as the mode register strobe signal MRR_STR the first strobe signal generation circuit 209 is adjusting a timing of the mode register strobe signal. For example, the first timing detection circuit 251 may compare the delay periods of the first to fourth variable delay mode register commands MRR_VD<1:4> with the delay period of the fixed delay mode register command MRR_FD to generate first to fourth selection signals (SEL<1:4> of FIG. 13). For example, the first selection signal SEL<1> may be enabled when the delay period of the first variable delay mode register command MRR_VD<1> is less than the delay period of the fixed delay mode register command MRR_FD and the delay period of the second variable delay mode register command MRR_VD<2> is equal to or greater than the delay period of the fixed delay mode register command MRR_FD. The second selection signal SEL<2> may be enabled when the delay period of the second variable delay mode register command MRR_VD<2> is less than the delay period of the fixed delay mode register command MRR_FD and the delay period of the third variable delay mode register command MRR_VD<3> is equal to or greater than the delay period of the fixed delay mode register command MRR_FD. The third selection signal SEL<3> may be enabled when the delay period of the third variable delay mode register command MRR_VD<3> is less than the delay period of the fixed delay mode register command MRR_FD and the delay period of the fourth variable delay mode register command MRR_VD<4> is equal to or greater than the delay period of the fixed delay mode register command MRR_FD. The fourth selection signal SEL<4> may be enabled when the delay period of the fourth variable delay mode register command MRR_VD<4> is less than the delay period of the fixed delay mode register command MRR_FD.

The first variable delay command generation circuit 254 may delay the mode register command MRR based on the first power gating signal PG1 to sequentially generate the plurality of variable delay mode register commands MRR_VD. The first variable delay command generation circuit 254 may delay the mode register command MRR based on the first power gating signal PG1 to sequentially generate the first, second, third, and fourth variable delay mode register commands MRR_VD<1:4>. The first variable delay command generation circuit 254 may sequentially generate the first, second, third, and fourth variable delay mode register commands MRR_VD<1:4>, the delay periods of which are varied based on the first power gating signal PG1 which is enabled to perform the first power gating operation. A configuration and an operation of the first variable delay command generation circuit 254 will be described with reference to FIG. 8 later.

The first fixed delay command generation circuit 255 may delay the mode register command MRR based on the second power gating signal PG2 to generate the fixed delay mode register command MRR_FD. The first fixed delay command generation circuit 255 may generate the fixed delay mode register command MRR_FD, the delay period of which is fixed based on the second power gating signal PG2 which is enabled to perform the second power gating operation. A configuration and an operation of the first fixed delay command generation circuit 255 will be described with reference to FIG. 10 later.

The first selection signal generation circuit 256 may compare the delay periods of the plurality of variable delay mode register commands MRR_FD with the delay period of the fixed delay mode register command MRR_FD to generate the plurality of selection signals SEL. The first selection signal generation circuit 256 may compare the delay periods of the first, second, third, and fourth variable delay mode register commands MRR_VD<1:4> with the delay period of the fixed delay mode register command MRR_FD to generate the first, second, third, and fourth selection signals SEL<1:4>. A configuration and an operation of the first selection signal generation circuit 256 will be described with reference to FIG. 11 later.

The first timing adjustment circuit 253 may include a mode register delay circuit 257 and a first strobe signal output circuit 258. The first timing adjustment circuit 253 may generate the mode register strobe signal MRR_STR based on the first power gating signal PG1, the variable delay mode register command MRR_VD, and the plurality of selection signals SEL.

The first timing adjustment circuit 253 may delay the variable delay mode register command MRR_FD by an internal predetermined delay period based on the first power gating signal PG1 to sequentially generate the plurality of internal mode register strobe signals IMRR_STR. The internal predetermined delay period may increase in proportion to a period that the first power gating operation for interrupting the supply of the first power source voltage VDD and the first ground voltage VSS is performed. The internal predetermined delay period may be set as a period from a point in time when the variable delay mode register command MRR_VD is inputted to the first timing adjustment circuit 253 until a point in time when the delayed operation code (OP_d of FIG. 19) obtained by delaying the operation code OP by the second predetermined delay period is generated, when the selection signal SEL is enabled.

The first timing adjustment circuit 253 may output one of the plurality of internal mode register strobe signals IMRR_STR as the mode register strobe signal MRR_STR based on the plurality of selection signals SEL. For example, the first timing adjustment circuit 253 may output one of first to fourth internal mode register strobe signals (IMRR_STR<1:4> of FIG. 15) as the mode register strobe signal MRR_STR based on the first to fourth selection signals SEL<1:4>.

The mode register delay circuit 257 may delay the variable delay mode register command MRR_VD by the internal predetermined delay period based on the first power gating signal PG1 to sequentially generate the plurality of internal mode register strobe signals IMRR_STR. The mode register delay circuit 257 may delay the fourth variable delay mode register command MRR_VD<4> by the internal predetermined delay period based on the first power gating signal PG1 to sequentially generate the first, second, third, and fourth internal mode register strobe signals (IMRR_STR<1:4> of FIG. 15). For example, the mode register delay circuit 257 may delay the fourth variable delay mode register command MRR_VD<4> by a first internal predetermined delay period based on the first power gating signal PG1 to generate the first internal mode register strobe signal (IMRR_STR<1> of FIG. 15). The first internal predetermined delay period may be set as a period from a point in time when the fourth variable delay mode register command MRR_VD<4> is inputted to the first timing adjustment circuit 253 until a point in time when the delayed operation code (OP_d of FIG. 19) obtained by delaying the operation code OP by the second predetermined delay period is generated, when the first selection signal SEL<1> is enabled. The mode register delay circuit 257 may delay the fourth variable delay mode register command MRR_VD<4> by a second internal predetermined delay period based on the first power gating signal PG1 to generate the second internal mode register strobe signal (IMRR_STR<2> of FIG. 15). The second internal predetermined delay period may be set as a period from a point in time when the fourth variable delay mode register command MRR_VD<4> is inputted to the first timing adjustment circuit 253 until a point in time when the delayed operation code (OP_d of FIG. 19) obtained by delaying the operation code OP by the second predetermined delay period is generated, when the second selection signal SEL<2> is enabled. The mode register delay circuit 257 may delay the fourth variable delay mode register command MRR_VD<4> by a third internal predetermined delay period based on the first power gating signal PG1 to generate the third internal mode register strobe signal (IMRR_STR<3> of FIG. 15). The third internal predetermined delay period may be set as a period from a point in time when the fourth variable delay mode register command MRR_VD<4> is inputted to the first timing adjustment circuit 253 until a point in time when the delayed operation code (OP_d of FIG. 19) obtained by delaying the operation code OP by the second predetermined delay period is generated, when the third selection signal SEL<3> is enabled. The mode register delay circuit 257 may delay the fourth variable delay mode register command MRR_VD<4> by a fourth internal predetermined delay period based on the first power gating signal PG1 to generate the fourth internal mode register strobe signal (IMRR_STR<4> of FIG. 15). The fourth internal predetermined delay period may be set as a period from a point in time when the fourth variable delay mode register command MRR_VD<4> is inputted to the first timing adjustment circuit 253 until a point in time when the delayed operation code (OP_d of FIG. 19) obtained by delaying the operation code OP by the second predetermined delay period is generated, when the fourth selection signal SEL<4> is enabled. That is, the first, second, third, and fourth internal mode register strobe signals (IMRR_STR<1:4> of FIG. 15) may be generated at the same timing as the delayed operation code (OP_d of FIG. 19) when the first, second, third, and fourth selection signals SEL<1:4> are enabled, respectively. The mode register delay circuit 257 may generate the first, second, third, and fourth internal mode register strobe signals (IMRR_STR<1:4> of FIG. 15), delay periods of which are varied based on the first power gating signal PG1 which is enabled to perform the first power gating operation. A configuration and an operation of the mode register delay circuit 257 will be described with reference to FIG. 15 later.

The first strobe signal output circuit 258 may output one of the plurality of internal mode register strobe signals IMRR_STR as the mode register strobe signal MRR_STR based on the plurality of selection signals SEL. The first strobe signal output circuit 258 may output one of the first, second, third, and fourth internal mode register strobe signals IMRR_STR<1:4> as the mode register strobe signal MRR_STR based on the first, second, third, and fourth selection signals SEL<1:4>. For example, the first strobe signal output circuit 258 may output the first internal mode register strobe signal IMRR_STR<1> as the mode register strobe signal MRR_STR when the first selection signal SEL<1> is enabled and may output the second internal mode register strobe signal IMRR_STR<2> as the mode register strobe signal MRR_STR when the second selection signal SEL<2> is enabled. In addition, the first strobe signal output circuit 258 may output the third internal mode register strobe signal IMRR_STR<3> as the mode register strobe signal MRR_STR when the third selection signal SEL<3> is enabled and may output the fourth internal mode register strobe signal IMRR_STR<4> as the mode register strobe signal MRR_STR when the fourth selection signal SEL<4> is enabled. A configuration and an operation of the first strobe signal output circuit 258 will be described with reference to FIG. 17 later.

Figure 8:
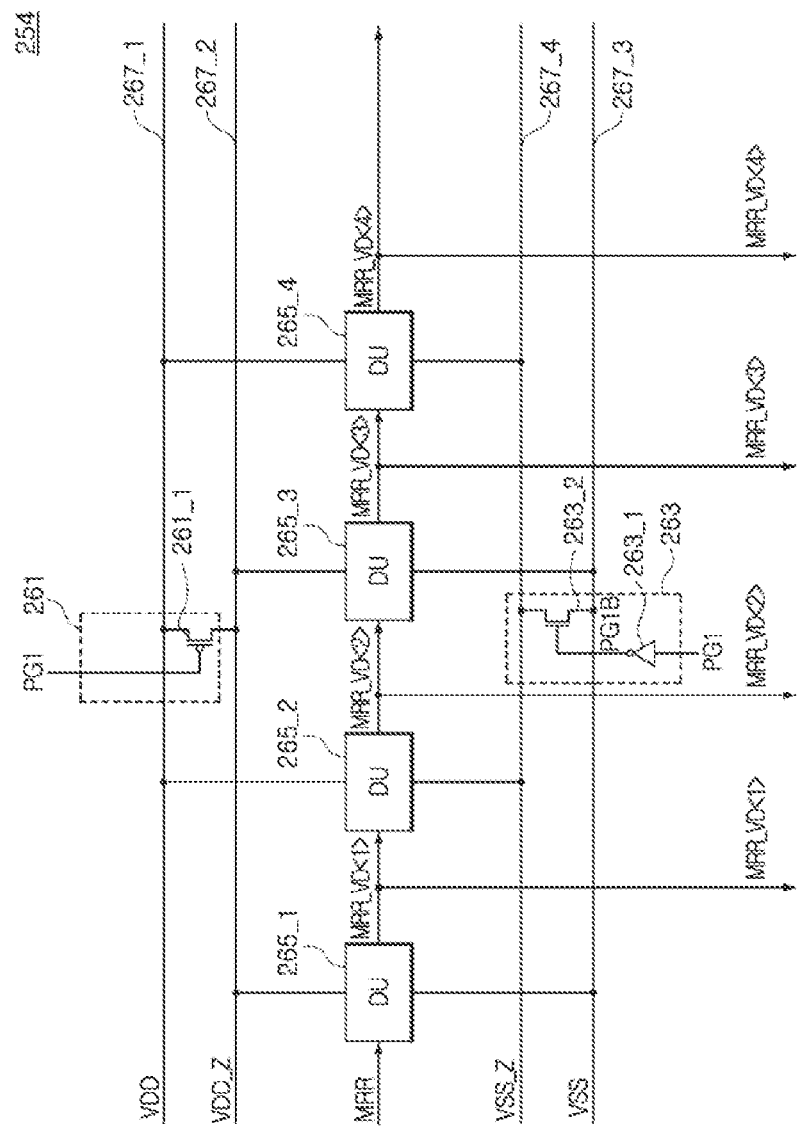
FIG. 8 is a circuit diagram illustrating a configuration of a first variable delay command generation circuit included in the first strobe signal generation circuit illustrated in FIG. 7.

FIG. 8 is a circuit diagram illustrating a configuration of the first variable delay command generation circuit 254 included in the first strobe signal generation circuit 209. As illustrated in FIG. 8, the first variable delay command generation circuit 254 may include a first power gating circuit 261, a first ground gating circuit 263, a plurality of unit delay circuits (DU) 265_1, 265_2, 265_3, and 265_4, a first power source line 267_1, a first virtual power source line 267_2, a first ground line 267_3, and a first virtual ground line 267_4.

The first power source voltage VDD may be supplied to the first power source line 267_1 through the power pad (not shown). A second power source voltage VDD_Z may be induced at the first virtual power source line 267_2 when the first power gating signal PG1 is disabled. The second power source voltage VDD_Z may be lower than the first power source voltage VDD. The first ground voltage VSS may be supplied to the first ground line 267_3 through the other power pad (not shown). A second ground voltage VSS_Z may be induced at the first virtual ground line 267_4 when the first power gating signal PG1 is disabled. The second ground voltage VSS_Z may be higher than the first ground voltage VSS.

The first power gating circuit 261 may be coupled between the first power source line 267_1 and the first virtual power source line 267_2 and may operate based on the first power gating signal PG1. The first power gating circuit 261 may control the supply of the first power source voltage VDD from the first power source line 267_1 to the first virtual power source line 267_2 based on the first power gating signal PG1. For example, the first power gating circuit 261 may interrupt the supply of the first power source voltage VDD from the first power source line 267_1 to the first virtual power source line 267_2 based on the first power gating signal PG1 which is enabled when the first power gating operation is performed. The first power gating circuit 261 may drive the first virtual power source line 267_2 to the second power source voltage VDD_Z when the first power gating signal PG1 is disabled. The first power gating circuit 261 may include a PMOS transistor 261_1. The PMOS transistor 261_1 may be turned off when the first power gating signal PG1 is enabled to have a logic "high" level and may be turned on when the first power gating signal PG1 is disabled to have a logic "low" level.

The first ground gating circuit 263 may be coupled between the first ground line 267_3 and the first virtual ground line 267_4 and may operate based on the first power gating signal PG1. The first ground gating circuit 263 may control the supply of the first ground voltage VSS from the first ground line 267_3 to the first virtual ground line 267_4 based on the first power gating signal PG1. For example, the first ground gating circuit 263 may interrupt the supply of the first ground voltage VSS from the first ground line 267_3 to the first virtual ground line 267_4 based on the first power gating signal PG1 which is enabled when the first power gating operation is performed. The first ground gating circuit 263 may drive the first virtual ground line 267_4 to the second ground voltage VSS_Z when the first power gating signal PG1 is disabled. The first ground gating circuit 263 may include an inverter 263_1 and an NMOS transistor 263_2. The inverter 263_1 may inversely buffer the first power gating signal PG1 to generate a first inverted power gating signal PG1B. The NMOS transistor 263_2 may be turned on when the first inverted power gating signal PG1B is enabled to have a logic "high" level and may be turned off when the first inverted power gating signal PG1B is disabled to have a logic "low" level.

Each of the plurality of unit delay circuits 265_1, 265_2, 265_3, and 265_4 may include a first MOS transistor and a second MOS transistor which are coupled in series. The first MOS transistor may be realized using a MOS transistor, and the second MOS transistor may be realized using an NMOS transistor.

The unit delay circuit 265_1 may be coupled between the first virtual power source line 267_2 and the first ground line 267_3 and may delay the mode register command MRR by a unit delay period to generate the first variable delay mode register command MRR_VD<1>. One of the first and second MOS transistors included in the unit delay circuit 265_1 may be selectively turned on when the first power gating operation is performed. For example, when the first power gating operation is performed, the first MOS transistor of the unit delay circuit 265_1 may be coupled to the first virtual power source line 2672 to be turned off and the second MOS transistor of the unit delay circuit 265_1 may be coupled to the first ground line 267_3 to be turned on.

The unit delay circuit 265_2 may be coupled between the first power source line 267_1 and the first virtual ground line 2671 and may delay the first variable delay mode register command MRR_VD<1> by the unit delay period to generate the second variable delay mode register command MRR_VD<2>. One of the first and second MOS transistors included in the unit delay circuit 265_2 may be selectively turned on when the first power gating operation is performed. For example, when the first power gating operation is performed, the first MOS transistor of the unit delay circuit 265_2 may be coupled to the first power source line 267_1 to be turned on and the second MOS transistor of the unit delay circuit 265_2 may be coupled to the first virtual ground line 2671 to be turned off. The first MOS transistor of the unit delay circuit 265_2 may be turned on when the second MOS transistor of the unit delay circuit 265_1 is turned on during the first power gating operation. The second MOS transistor of the unit delay circuit 265_2 may be turned on when the first MOS transistor of the unit delay circuit 265_1 is turned on during the first power gating operation.

The unit delay circuit 265_3 may be coupled between the first virtual power source line 267_2 and the first ground line 267_3 and may delay the second variable delay mode register command MRR_VD<2> by the unit delay period to generate the third variable delay mode register command MRR_VD<3>. One of the first and second MOS transistors included in the unit delay circuit 265_3 may be selectively turned on when the first power gating operation is performed. For example, when the first power gating operation is performed, the first MOS transistor of the unit delay circuit 265_3 may be coupled to the first virtual power source line 267_2 to be turned off and the second MOS transistor of the unit delay circuit 265_3 may be coupled to the first ground line 267_3 to be turned on. The first MOS transistor of the unit delay circuit 265_3 may be turned on when the second MOS transistor of the unit delay circuit 265_2 is turned on during the first power gating operation. The second MOS transistor of the unit delay circuit 265_3 may be turned on when the first MOS transistor of the unit delay circuit 265_2 is turned on during the first power gating operation.

The unit delay circuit 265_4 may be coupled between the first power source line 267_1 and the first virtual ground line 267_4 and may delay the third variable delay mode register command MRR_VD<3> by the unit delay period to generate the fourth variable delay mode register command MRR_VD<4>. One of the first and second MOS transistors included in the unit delay circuit 265_4 may be selectively turned on when the first power gating operation is performed. For example, when the first power gating operation is performed, the first MOS transistor of the unit delay circuit 265_4 may be coupled to the first power source line 267_1 to be turned on and the second MOS transistor of the unit delay circuit 265_4 may be coupled to the first virtual ground line 267_4 to be turned off. The first MOS transistor of the unit delay circuit 265_4 may be turned on when the second MOS transistor of the unit delay circuit 265_3 is turned on during the first power gating operation. The second MOS transistor of the unit delay circuit 265_4 may be turned on when the first MOS transistor of the unit delay circuit 265_3 is turned on during the first power gating operation.

The unit delay circuit 265_1 and the unit delay circuit 265_3 may receive the first ground voltage VSS from the first ground line 267_3 when the first power gating signal PG1 is enabled. The unit delay circuit 265_2 and the unit delay circuit 265_4 may receive the first power source voltage VDD from the first power source line 267_1 when the first power gating signal PG1 is enabled. That is, when the first power gating signal PG1 is enabled, the first power source voltage VDD may be supplied to some of the plurality of unit delay circuits 265_1, 265_2, 265_3, and 265_4 and the first ground voltage VSS may be supplied to the others of the plurality of unit delay circuits 265_1, 265_2, 265_3, and 265_4. Thus, the first variable delay command generation circuit 254 receiving power supply voltages with a zigzag power gating technique may cause the BTI phenomenon during a period the first power gating operation for interrupting the supply of the first power source voltage VDD and the first ground voltage VSS is performed. Accordingly, the first variable delay command generation circuit 254 may sequentially generate the first, second, third, and fourth variable delay mode register commands MRR_VD<1:4>, delay periods of which are varied in proportion to a period that the first power gating operation is performed.

Figure 9:
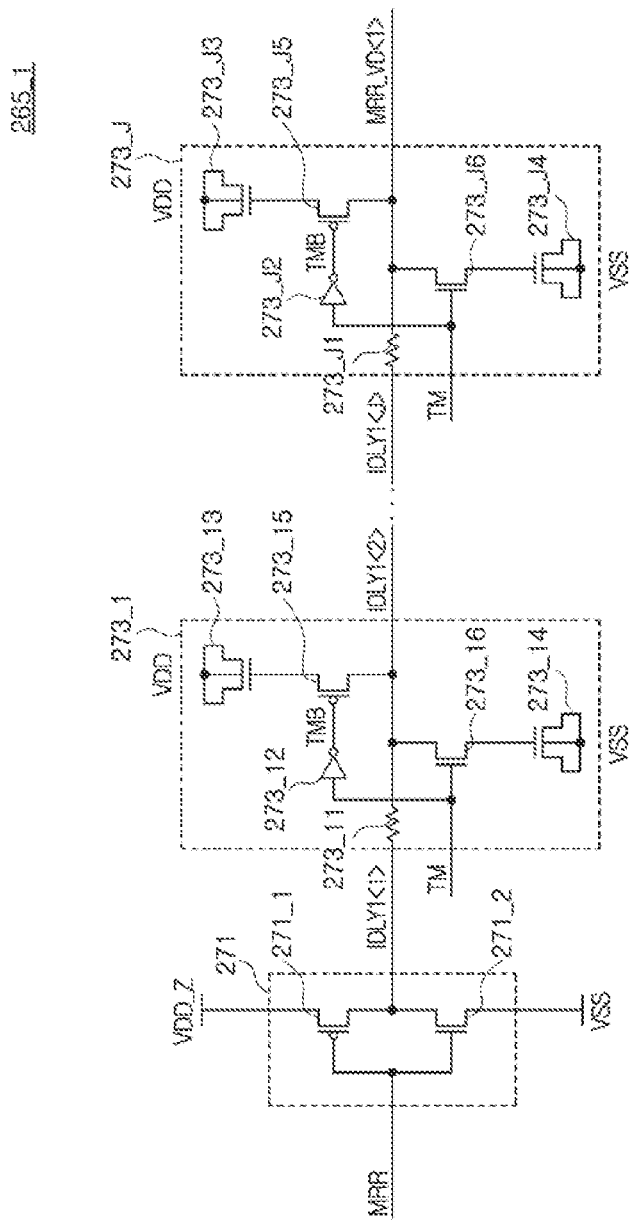
FIG. 9 is a circuit diagram illustrating a configuration of a unit delay circuit included in the first variable delay command generation circuit illustrated in FIG. 8.

FIG. 9 is a circuit diagram illustrating a configuration of the unit delay circuit 265_1 included in the first variable delay command generation circuit 254. As illustrated in FIG. 9, the unit delay circuit 265_1 may include an inverter 271 and a plurality of R-C delay circuits 273_1~273_J which are coupled in series.

The inverter 271 may inversely buffer the mode register command MRR to generate a first bit IDLY1<1> of a first internal delay sign& IDLY1<1:3>, which is delayed by a certain period. The inverter 271 may include a first MOS transistor 271_1 and a second MOS transistor 271_2 which are coupled in series. A gate terminal of the first MOS transistor 271_1 may be coupled to a gate terminal of the second MOS transistor 271_2. The second power source voltage VDD_Z may be supplied to a source terminal of the first MOS transistor 271_1. A drain terminal of the first MOS transistor 271_1 may be coupled to a drain terminal of the second MOS transistor 271_2. The first ground voltage VSS may be supplied to a source terminal of the second MOS transistor 271_2.

The R-C delay circuit 273_1 may include a resistor 273_11, an inverter 273_12, capacitors 273_13 and 273_14, a PMOS transistor 273_15, and an NMOS transistor 273_16. The R-C delay circuit 273_1 may delay the first bit IDLY1<1> of the first internal delay signal IDLY1<1:3> by an R-C delay time of the R-C delay circuit 273_1 to generate a second bit IDLY1<2> of the first internal delay signal IDLY1<1:3> in a test mode activated by a test mode signal TM. The test mode signal TM may be provided by the controller (110 of FIG. 1) and may be enabled to activate the test mode. The resistor 273_11 may have one terminal to which the first bit IDLY1<1> of a first internal delay signal IDLY1<1:3> is applied and the other terminal coupled to drain terminals of the PMOS transistor 273_15 and the NMOS transistor 273_16. The drain terminals of the PMOS transistor 273_15 and the NMOS transistor 273_16 may be coupled to each other to constitute an output terminal of the R-C delay circuit 273_1. The resistor 273_11 may have a constant resistance value in some embodiments. The inverter 273_12 may inversely buffer the test mode signal TM to generate an inverted test mode signal TMB. The capacitor 273_13 may include one terminal to which the first power source voltage VDD is supplied and the other terminal coupled to a source terminal of the PMOS transistor 273_15. The capacitor 273_13 may have a constant capacitance value in some embodiments. The PMOS transistor 273_15 may be turned on by the inverted test mode signal TMB having a logic "low" level in the test mode. The capacitor 273_14 may include one terminal to which the first ground voltage VSS is supplied and the other terminal coupled to a source terminal of the NMOS transistor 273_16. The capacitor 273_14 may have a constant capacitance value in some embodiments. The PMOS transistor 273_16 may be turned on by the test mode signal TM having a logic "high" level in the test mode.

The R-C delay circuit 273_J may include a resistor 273_J1, an inverter 273_J2, capacitors 273_J3 and 273_J4, a PMOS transistor 273_J5, and an NMOS transistor 273_J6. The R-C delay circuit 273_J may delay a $J^{th}$ bit IDLY1<3> of the first internal delay signal IDLY1<1:3> by an R-C delay time of the R-C delay circuit 273_J to generate the first variable delay mode register command MRR_VD<1> in the test mode activated by a test mode signal TM (where, "J" is set as a natural number which is equal to or greater than two). The R-C delay circuit 273_J may have the same configuration as the R-C delay circuit 273_1 and may perform the same operation as the R-C delay circuit 273_1. Thus, detailed descriptions of the R-C delay circuit 273_J will be omitted hereinafter.

Figure 10:
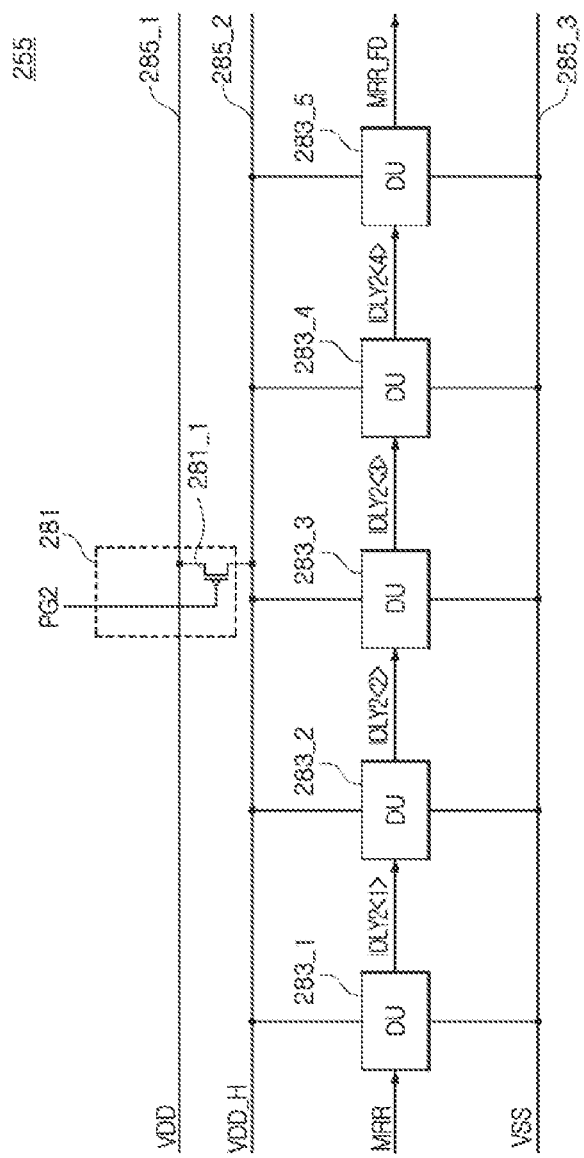
FIG. 10 is a circuit diagram illustrating a configuration of a first fixed delay command generation circuit included in the first strobe signal generation circuit illustrated in FIG. 7.

FIG. 10 is a circuit diagram illustrating a configuration of the first fixed delay command generation circuit 255 included in the first strobe signal generation circuit 209. As illustrated in FIG. 10, the first fixed delay command generation circuit 255 may include a second power gating circuit 281, a plurality of unit delay circuits (DU) 283_1, 283_2, 283_3, 283_4, and 283_5, a second power source line 285_1, a second virtual power source line 285_2, and a second ground line 285_3.

The first power source voltage VDD may be supplied to the second power source line 285_1 through the power pad (not shown). A third power source voltage VDD_H may be induced at the second virtual power source line 285_2 when the second power gating signal PG2 is disabled. The third power source voltage VDD_H may be lower than the first power source voltage VDD. The first ground voltage VSS may be supplied to the second ground line 285_3 through the other power pad (not shown).

The second power gating circuit 281 may be coupled between the second power source line 285_1 and the second virtual power source line 285_2 and may operate based on the second power gating signal PG2. The second power gating circuit 281 may control the supply of the first power source voltage VDD from the second power source line 285_1 to the second virtual power source line 285_2 based on the second power gating signal PG2. For example, the second power gating circuit 281 may interrupt the supply of the first power source voltage VDD from the second power source line 285_1 to the second virtual power source line 285_2 based on the second power gating signal PG2 which is enabled when the second power gating operation is performed. The second power gating circuit 281 may drive the second virtual power source line 285_2 to the third power source voltage VDD_H when the second power gating signal PG2 is disabled. The second power gating circuit 281 may include a PMOS transistor 281_1. The PMOS transistor 281_1 may be turned off when the second power gating signal PG2 is enabled to have a logic "high" level and may be turned on when the second power gating signal PG2 is disabled to have a logic "low" level.

Each of the plurality of unit delay circuits 283_1, 283_2, 283_4, and 283_5 may include a first MOS transistor and a second MOS transistor which are coupled in series between the second virtual power source line 285_2 and the second ground line 285_3. The first MOS transistor may be realized using a PMOS transistor, and the second MOS transistor may be realized using an NMOS transistor.

The unit delay circuit 283_1 may be coupled between the second virtual power source line 285_2 and the second ground line 285_3 and nay delay the mode register command MRR by a unit delay period to generate a first bit IDLY2<1> of a second internal delay signal IDLY2<1:4>. Both of the first and second MOS transistors included in the unit delay circuit 283_1 may be turned off when the second power gating operation is performed. For example, when the second power gating operation is performed, the first MOS transistor of the unit delay circuit 283_1 may be coupled to the second virtual power source line 285_2 to be turned off and the second MOS transistor of the unit delay circuit 283_1 may be coupled to the second ground line 285_3 to be turned off.

The unit delay circuit 283_2 may be coupled between the second virtual power source line 285_2 and the second ground line 285_3 and may delay the first bit IDLY2<1> of the second internal delay signal IDLY2<1:4> by the unit delay period to generate a second bit IDLY2<2> of the second internal delay signal IDLY2<1:4>. Both of the first and second MOS transistors included in the unit delay circuit 283_2 may be turned off when the second power gating operation is performed. For example, when the second power gating operation is performed, the first MOS transistor of the unit delay circuit 283_2 may be coupled to the second virtual power source line 285_2 to be turned off and the second MOS transistor of the unit delay circuit 283_2 may be coupled to the second ground line 285_3 to be turned off.

The unit delay circuit 283_3 may be coupled between the second virtual power source line 285_2 and the second ground line 285_3 and may delay the second bit IDLY2<2> of the second internal delay signal IDLY2<1:4> by the unit delay period to generate a third bit IDLY2<3> of the second internal delay signal IDLY2<1:4>. Both of the first and second MOS transistors included in the unit delay circuit 283_3 may be turned off when the second power gating operation is performed. For example, when the second power gating operation is performed, the first MOS transistor of the unit delay circuit 283_3 may be coupled to the second virtual power source line 285_2 to be turned off and the second MOS transistor of the unit delay circuit 283_3 may be coupled to the second ground line 285_3 to be turned off.

The unit delay circuit 283_4 may be coupled between the second virtual power source line 285_2 and the second ground line 285_3 and may delay the third bit IDLY2<3> of the second internal delay signal IDLY2<1:4> by the unit delay period to generate a fourth bit IDLY2<4> of the second internal delay signal IDLY2<1:4>. Both of the first and second MOS transistors included in the unit delay circuit 283_4 may be turned off when the second power gating operation is performed. For example, when the second power gating operation is performed, the first MOS transistor of the unit delay circuit 283_4 may be coupled to the second virtual power source line 285_2 to be turned off and the second MOS transistor of the unit delay circuit 283_4 may be coupled to the second ground line 285_3 to be turned off.

The unit delay circuit 283_5 may be coupled between the second virtual power source line 285_2 and the second ground line 285_3 and may delay the fourth bit IDLY2<4> of the second internal delay signal IDLY2<1:4> by the unit delay period to generate the fixed delay mode register command MRR_FD. Both of the first and second MOS transistors included in the unit delay circuit 283_5 may be turned off when the second power gating operation is performed. For example, when the second power gating operation is performed, the first MOS transistor of the unit delay circuit 283_5 may be coupled to the second virtual power source line 285_2 to be turned off and the second MOS transistor of the unit delay circuit 283_5 may be coupled to the second ground line 285_3 to be turned off.

Each of the plurality of unit delay circuits 283_1, 283_2, 283_3, 283_4, and 283_5 may be coupled between the second virtual power source line 285_2 and the second ground line 285_3. When the second power gating signal PG2 is enabled to perform the second power gating operation, the second power gating circuit 281 may be turned off to interrupt the supply of the first power source voltage VDD from the second power source line 285_1 to the second virtual power source line 285_2. That is, when the second power gating operation is performed, the second virtual power source line 285_2 may be electrically floated. Thus, the first fixed delay command generation circuit 255 receiving power supply voltages with the header-only power gating technique may suppress the BTI phenomenon during a period the second power gating operation for interrupting the supply of the first power source voltage VDD is performed. Accordingly, the first fixed delay command generation circuit 255 may generate the fixed delay mode register command MRR_FD, a delay period of which is fixed regardless of a period time that the second power gating operation is performed.

Figure 11:
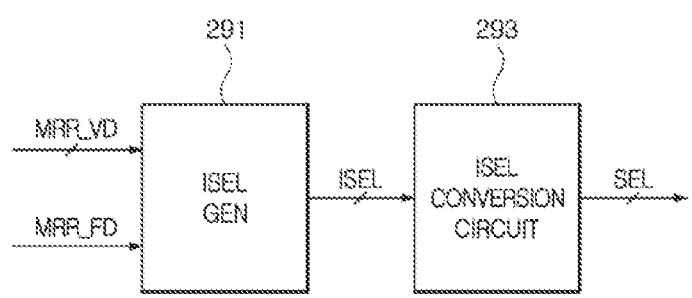
FIG. 11 is a block diagram illustrating a configuration of a first selection signal generation circuit included in the first strobe signal generation circuit illustrated in FIG. 7.

FIG. 11 is a block diagram illustrating a configuration of the first selection signal generation circuit 256 included in the first strobe signal generation circuit 209. As illustrated in FIG. 11, the first selection signal generation circuit 256 may include an internal selection signal generation circuit 291 and an internal selection signal conversion circuit 293.

The internal selection signal generation circuit 291 may compare the plurality of variable delay mode register commands MRR_VD with the fixed delay mode register command MRR_FD to generate a plurality of internal selection signals ISEL. The internal selection signal generation circuit 291 may output the first, second, third, and fourth variable delay mode register commands MRR_VD<1:4> as respective ones of first, second, third, and fourth internal selection signals ISEL<1:4> constituting the selection signals SEL at a point in time when the fixed delay mode register command MRR_FD is enabled. For example, the internal selection signal generation circuit 291 may output the first variable delay mode register command MRR_VD<1> as the first internal selection signal ISEL<1> at a point in time when the fixed delay mode register command MRR_FD is enabled. The internal selection signal generation circuit 291 may output the second variable delay mode register command MRR_VD<2> as the second internal selection signal ISEL<2> at a point in time when the fixed delay mode register command MRR_FD is enabled. The internal selection signal generation circuit 291 may output the third variable delay mode register command MRR_VD<3> as the third internal selection signal ISEL<3> at a point in time when the fixed delay mode register command MRR_FD is enabled. The internal selection signal generation circuit 291 may output the fourth variable delay mode register command MRR_VD<4> as the fourth internal selection signal ISEL<4> at a point in time when the fixed delay mode register command MRR_FD is enabled. A configuration and an operation of the internal selection signal generation circuit 291 will be described with reference to FIG. 12 later.

The internal selection signal conversion circuit 293 may convert the plurality of internal selection signals ISEL to generate the plurality of selection signals SEL. The internal selection signal conversion circuit 293 may selectively enable one of the first, second, third, and fourth selection signals SEL<1:4> according to a logic level combination of the first, second, third, and fourth internal selection signals ISEL<1:4>. For example, the internal selection signal conversion circuit 293 may generate the first selection signal SEL<1> which is enabled when the first internal selection signal ISEL<1> is enabled and the second, third and fourth internal selection signals ISEL<2:4> are disabled. The internal selection signal conversion circuit 293 may generate the second selection signal SEL<2> which is enabled when the second internal selection signal ISEL<2> is enabled and the third and fourth internal selection signals ISEL<3:4> are disabled. The internal selection signal conversion circuit 293 may generate the third selection signal SEL<3> which is enabled when the third internal selection signal ISEL<3> is enabled and the fourth internal selection signal ISEL<4> is disabled. The internal selection signal conversion circuit 293 may generate the fourth selection signal SEL<4> which is enabled when the fourth internal selection signal ISEL<4> is enabled. A configuration and an operation of the internal selection signal conversion circuit 293 will be described with reference to FIG. 13 later.

Figure 12:
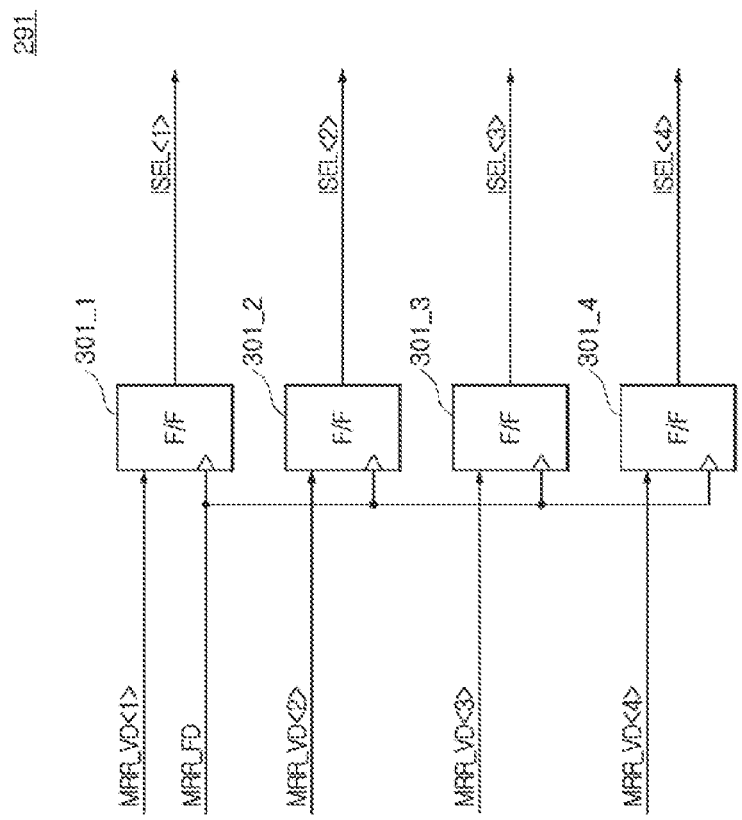
FIG. 12 is a circuit diagram illustrating a configuration of an internal selection signal generation circuit included in the first selection signal generation circuit illustrated in FIG. 11.

FIG. 12 is a circuit diagram illustrating a configuration of the internal selection signal generation circuit 291 included in the first selection signal generation circuit 256. As illustrated in FIG. 12, the internal selection signal generation circuit 291 may include a plurality of flip-flops 301_1, 301_2, 301_3, and 301_4. The flip-flop 301_1 may latch the first variable delay mode register command MRR_VD<1> to output the latched signal of the first variable delay mode register command MRR_VD<1> as the first internal selection signal ISEL<1> when the fixed delay mode register command MRR_FD is enabled to have a logic "high" level. The flip-flop 301_2 may latch the second variable delay mode register command MRR_VD<2> to output the latched signal of the second variable delay mode register command MRR_VD<2> as the second internal selection signal ISEL<2> when the fixed delay mode register command MRR_FD is enabled to have a logic "high" level. The flip-flop 301_3 may latch the third variable delay mode register command MRR_VD<3> to output the latched signal of the third variable delay mode register command MRR_VD<3> as the third internal selection signal ISEL<3> when the fixed delay mode register command MRR_FD is enabled to have a logic "high" level. The flip-flop 301_4 may latch the fourth variable delay mode register command MRR_VD<4> to output the latched signal of the fourth variable delay mode register command MRR_VD<4> as the fourth internal selection signal ISEL<4> when the fixed delay mode register command MRR_FD is enabled to have a logic "high" level.

Figure 13:
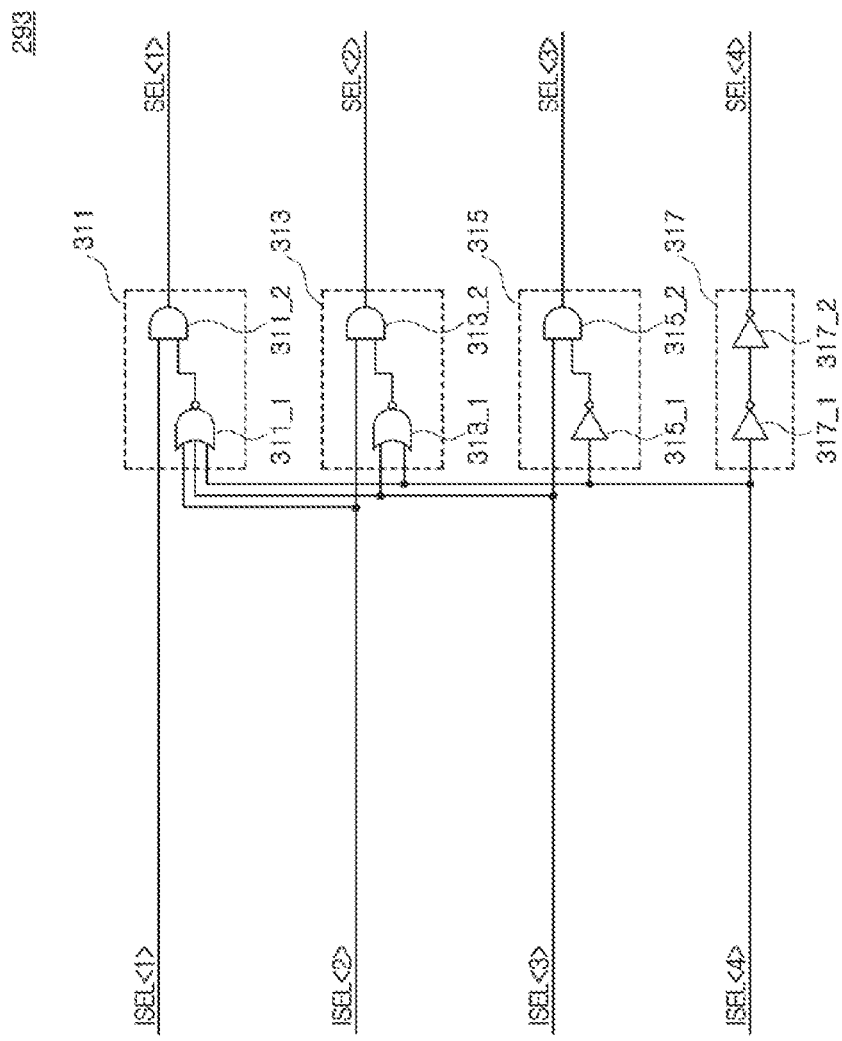
FIG. 13 is a circuit diagram illustrating a configuration of an internal selection signal generation circuit included in the first selection signal generation circuit illustrated in FIG. 11.

FIG. 13 is a circuit diagram illustrating a configuration of the internal selection signal conversion circuit 293 included in the first selection signal generation circuit 256. As illustrated in FIG. 13, the internal selection signal conversion circuit 293 may include first, second, third, and fourth internal selection signal conversion circuits 311, 313, 315, and 317.

The first internal selection signal conversion circuit 311 may generate the first selection signal SEL<1> based on the first, second, third, and fourth internal selection signals ISEL<1:4>. The first internal selection signal conversion circuit 311 may generate the first selection signal SEL<1> which is enabled to have a logic "high" level when the first internal selection signal ISEL<1> is enabled to have a logic "high" level and the second, third, and fourth internal selection signals ISEL<2:4> are disabled to have a logic "low" level. The first internal selection signal conversion circuit 311 may include a NOR gate 311_1 and an AND gate 311_2. The NOR gate 311_1 may perform a logical NOR operation of the second, third, and fourth internal selection signals ISEL<2:4>, The AND gate 311_2 may perform a logical AND operation of the first internal selection signal ISEL<1> and an output signal of the NOR gate 311_1 to generate and output the first selection signal SEL<1>.

The second internal selection signal conversion circuit 313 may generate the second selection signal SEL<2> based on the second, third, and fourth internal selection signals ISEL<2:4>. The second internal selection signal conversion circuit 313 may generate the second selection signal SEL<2> which is enabled to have a logic "high" level when the second internal selection signal ISEL<2> is enabled to have a logic "high" level and the third and fourth internal selection signals ISEL<3:4> are disabled to have a logic "low" level, The second internal selection signal conversion circuit 313 may include a NOR gate 313_1 and an AND gate 313_2. The NOR gate 313_1 may perform a logical NOR operation of the third and fourth internal selection signals ISEL<3:4>, The AND gate 313_2 may perform a logical AND operation of the second internal selection signal ISEL<2> and an output signal of the NOR gate 313_1 to generate and output the second selection signal SEL<2>.

The third internal selection signal conversion circuit 315 may generate the third selection signal SEL<3> based on the third and fourth internal selection signals ISEL<3:4>. The third internal selection signal conversion circuit 315 may generate the third selection signal SEL<3> which is enabled to have a logic "high" level when the third internal selection signal ISEL<3> is enabled to have a logic "high" level and the fourth internal selection signal ISEL<4> is disabled to have a logic "low" level. The third internal selection signal conversion circuit 315 may include an inverter 315_1 and an AND gate 315_2. The inverter 315_1 may inversely buffer the fourth internal selection signal ISEL<4> to output the inversely buffered signal of the fourth internal selection signal ISEL<4>. The AND gate 315_2 may perform a logical AND operation of the third internal selection signal ISEL<3> and an output signal of the inverter 315_1 to generate and output the third selection signal SEL<3>.

The fourth internal selection signal conversion circuit 317 may generate the fourth selection signal SEL<4> based on the fourth internal selection signal ISEL<4>. The fourth internal selection signal conversion circuit 317 may generate the fourth selection signal SEL<4> which is enabled to have a logic "high" level when the fourth internal selection signal ISEL<4> is enabled to have a logic "high" level. The fourth internal selection signal conversion circuit 317 may include inverters 317_1 and 317_2 which are coupled in series. The inverter 317_1 may inversely buffer the fourth internal selection signal ISEL<4> to output the inversely buffered signal of the fourth internal selection signal ISEL<4>. The inverter 317_2 may inversely buffer an output signal of the inverter 317_1 to generate and output the fourth selection signal SEL<4>. An operation of the internal selection signal conversion circuit 293 for converting the internal selection signal ISEL (i.e., the first to fourth internal selection signals ISEL<1:4>) into the selection signal SEL (le, the first to fourth selection signals SEL<1:4>) will be described hereinafter with reference to FIG. 14.

FIG. 14 is a table illustrating an operation of the internal selection signal conversion circuit 293 for converting the first to fourth internal selection signals ISEL<1:4> into the first to fourth selection signals SEL<1:4>. Referring to FIG. 14, the internal selection signal conversion circuit 293 may enable the first selection signal SEL<1> to a logic "high(H)" level and may disable the second to fourth selection signals SEL<2:4> to a logic "low(L)" level, when the first internal selection signal ISEL<1> is enabled to have a logic "high (H)" level and the second to fourth internal selection signals ISEL<2:4> are disabled to have a logic "low(L)" level.

The internal selection signal conversion circuit 293 may enable the second selection signal SEL<2> to a logic "high (H)" level and may disable the first, third and fourth selection signals SEL<1> and SEL<3:4> to a logic "low(L)" level, when the second internal selection signal ISEL<2> is enabled to have a logic "high(H)" level and the third and fourth internal selection signals ISEL<3:4> are disabled to have a logic "low(L)" level. In such a case, the internal selection signal conversion circuit 293 may generate the second selection signal SEL<2> having a logic "high(H)" level regardless of a logic level of the first internal selection signal ISEL<1>. Thus, the first internal selection signal ISEL<1> may be referred to as a "DON'T CARE STATE (X)" when the second selection signal SEL<2> having a logic "high(H)" level is generated.

The internal selection signal conversion circuit 293 may enable the third selection signal SEL<3> to a logic "high (H)" level and may disable the first, second and fourth selection signals SEL<1:2> and SEL<4> to a logic "low(L)" level, when the third internal selection signal ISEL<3> is enabled to have a logic "high(H)" level and the fourth internal selection signal ISEL<4> is disabled to have a logic "low(L)" level. In such a case, the first and second internal selection signals ISEL<1:2> may be referred to as a "DON'T CARE STATE(X)" when the third selection signal SEL<3> having a logic "high(H)" level is generated.

The internal selection signal conversion circuit 293 may enable the fourth selection signal SEL<4> to a logic "high (H)" level and may disable the first, second and third selection signals SEL<1:3> to a logic "low(L)" level, when the fourth internal selection signal ISEL<4> is enabled to have a logic "high(H)" level. In such a case, the first to third internal selection signals ISEL<1:3> may be referred to as a "DON'T CARE STATE(X)" when the fourth selection signal SEL<4> having a logic "high(H)" level is generated.

Figure 15:
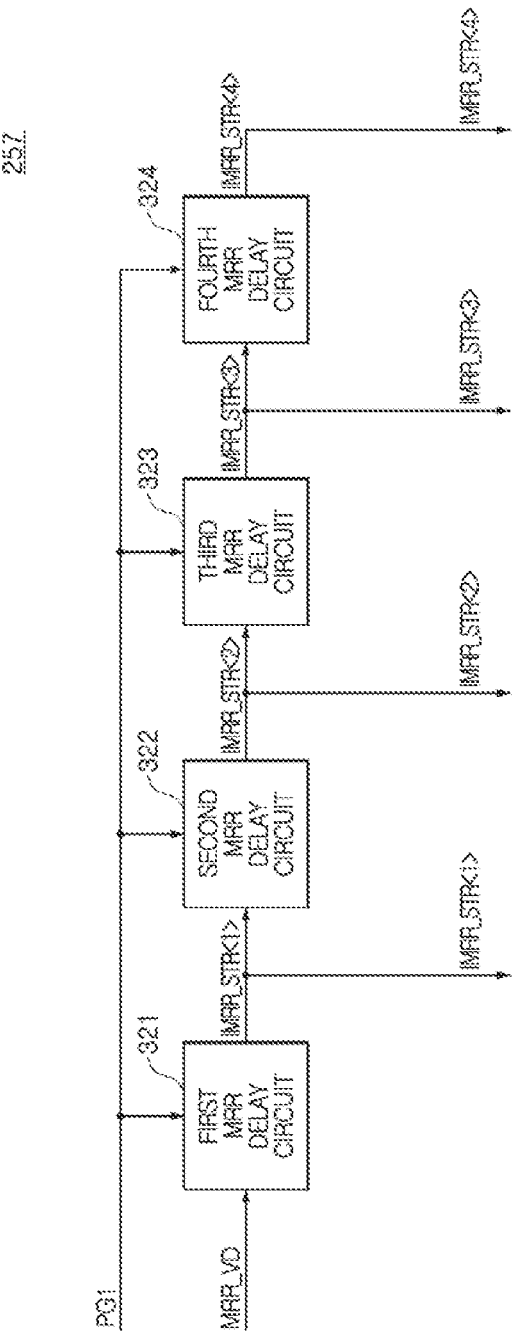
FIG. 15 is a block diagram illustrating a configuration of a mode register delay circuit included in the first strobe signal generation circuit illustrated in FIG. 7.

FIG. 15 is a block diagram illustrating a configuration of the mode register delay circuit 257 included in the first strobe signal generation circuit 209. As illustrated in FIG. 15, the mode register delay circuit 257 may include a first mode register delay circuit 321, a second mode register delay circuit 322, a third mode register delay circuit 323, and a fourth mode register delay circuit 324.

The first mode register delay circuit 321 may delay the variable delay mode register command MRR_VD by the first internal predetermined delay period based on the first power gating signal PG1 to generate the first internal mode register strobe signal IMRR_STR<1>. For example, the first mode register delay circuit 321 may delay the fourth variable delay mode register command MRR_VD<4> by the first internal predetermined delay period based on the first power gating signal PG1 to generate the first internal mode register strobe signal IMRR_STR<1>. A configuration and an operation of the first node register delay circuit 321 will be described with reference to FIG. 16 later.

The second mode register delay circuit 322 may delay the first internal mode register strobe signal IMRR_STR<1> by a period, which is less than the second internal predetermined delay period by the first internal predetermined delay period, based on the first power gating signal PG1 to generate the second internal mode register strobe signal IMRR_STR<2>.

The third mode register delay circuit 323 may delay the second internal mode register strobe signal IMRR_STR<2> by a period, which is less than the third internal predetermined delay period by the second internal predetermined delay period, based on the first power gating signal PG1 to generate the third internal mode register strobe signal IMRR_STR<3>.

The fourth mode register delay circuit 324 may delay the third internal mode register strobe signal IMRR_STR<3> by a period, which is less than the fourth internal predetermined delay period by the third internal predetermined delay period, based on the first power gating signal PG1 to generate the fourth internal mode register strobe signal IMRR_STR<4>.

Figure 16:
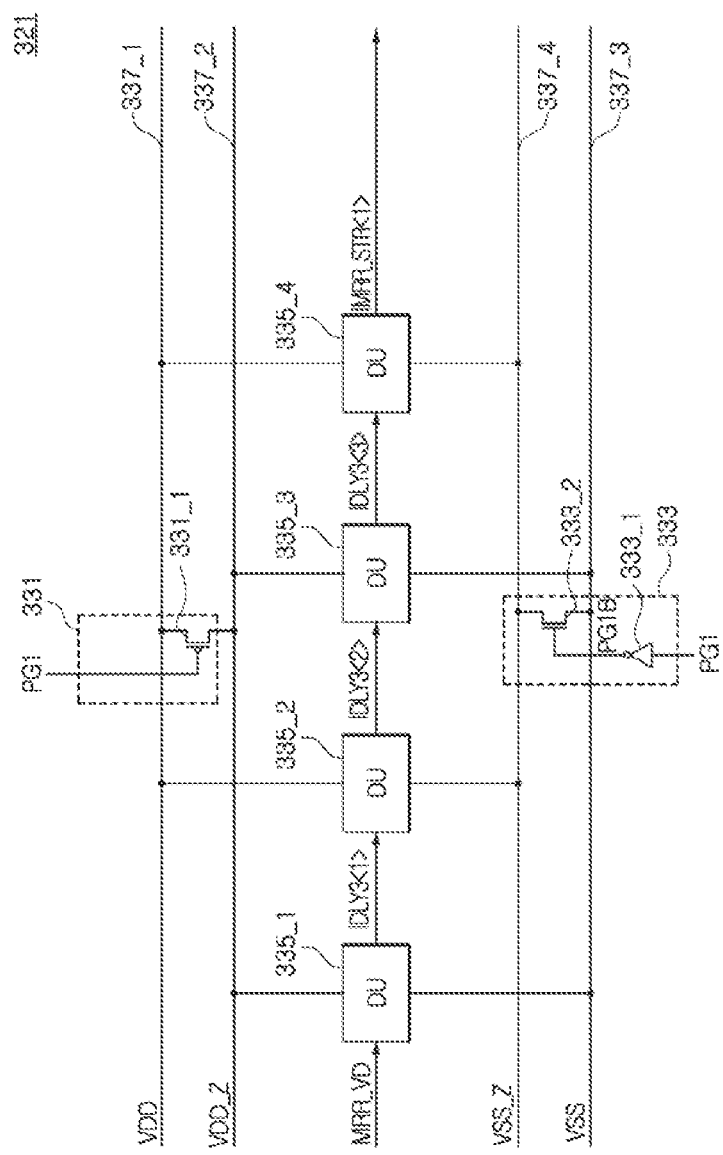
FIG. 16 is a circuit diagram illustrating a configuration of a first mode register delay circuit included in the mode register delay circuit illustrated in FIG. 15.

FIG. 16 is a circuit diagram illustrating a configuration of the first mode register delay circuit 321 included in the mode register delay circuit 257. As illustrated in FIG. 16, the first mode register delay circuit 321 may include a third power gating circuit 331, a third ground gating circuit 333, a plurality of unit delay circuits (DU) 335_1, 335_2, 335_3, and 335_4, a third power source line 337_1, a third virtual power source line 337_2, a third ground line 337_3, and a second virtual ground line 337_4.

The third power source line 337_1, the third virtual power source line 337_2, the third ground line 337_3, and the second virtual ground line 337_4 may have substantially the same function as respective ones of the first power source line 267_1, the first virtual power source line 267_2, the first ground line 267_3, and the first virtual ground line 267_4 described with reference to FIG. 8. Thus, the detailed descriptions of the third power source line 337_1, the third virtual power source line 337_2, the third ground line 337_3, and the second virtual ground line 337_4 will be omitted hereinafter.

The third power gating circuit 331 may include a PMOS transistor 331_1. The third power gating circuit 331 may perform substantially the same operation as the first power gating circuit 261 described with reference to FIG. 8. Thus, the detailed description of the third power gating circuit 331 will be omitted hereinafter.

The third ground gating circuit 333 may include an inverter 333_1 and an NMOS transistor 333_2. The third ground gating circuit 333 may perform substantially the same operation as the first ground gating circuit 263 described with reference to FIG. 8. Thus, the detailed description of the third ground gating circuit 333 will be omitted hereinafter.

Each of the plurality of unit delay circuits 335_1, 335_2, 335_3, and 335_4 may include a first MOS transistor and a second MOS transistor which are coupled in series. The first MOS transistor may be realized using a PMOS transistor, and the second MOS transistor may be realized using an NMOS transistor.

The unit delay circuit 335_1 may be coupled between the third virtual power source line 337_2 and the third ground line 337_3 and may delay the variable delay mode register command MRR_VD by a unit delay period to generate a first bit IDLY3<1> of a third internal delay signal IDLY3<1:3>. One of the first and second MOS transistors included in the unit delay circuit 335_1 may be selectively turned on when the first power gating operation is performed. For example, when the first power gating operation is performed, the first MOS transistor of the unit delay circuit 335_1 may be coupled to the third virtual power source line 337_2 to be turned off and the second MOS transistor of the unit delay circuit 335_1 may be coupled to the third ground line 337_3 to be turned on.

The unit delay circuit 335_2 may be coupled between the third power source line 337_1 and the second virtual ground line 337_4 and may delay the first bit IDLY3<1> of the third internal delay signal IDLY3<1:3> by the unit delay period to generate a second bit IDLY3<2> of the third internal delay signal IDLY3<1:3>. One of the first and second MOS transistors included in the unit delay circuit 335_2 may be selectively turned on when the first power gating operation is performed. For example, when the first power gating operation is performed, the first MOS transistor of the unit delay circuit 335_2 may be coupled to the third power source line 3371 to be turned on and the second MOS transistor of the unit delay circuit 335_2 may be coupled to the second virtual ground line 337_4 to be turned off. The first MOS transistor of the unit delay circuit 335_2 may be turned on when the second MOS transistor of the unit delay circuit 335_1 is turned on during the first power gating operation. The second MOS transistor of the unit delay circuit 335_2 may be turned on when the first MOS transistor of the unit delay circuit 335_1 is turned on during the first power gating operation.

The unit delay circuit 335_3 may be coupled between the third virtual power source line 337_2 and the third ground line 337_3 and may delay the second bit IDLY3<2> of the third internal delay signal IDLY3<1:3> by the unit delay period to generate a third bit IDLY3<3> of the third internal delay signal IDLY3<1:3>. One of the first and second MOS transistors included in the unit delay circuit 335_3 may be selectively turned on when the first power gating operation is performed. For example, when the first power gating operation is performed, the first MOS transistor of the unit delay circuit 335_3 may be coupled to the third virtual power source line 337_2 to be turned off and the second MOS transistor of the unit delay circuit 335_3 may be coupled to the third ground line 337_3 to be turned on. The first MOS transistor of the unit delay circuit 335_3 may be turned on when the second MOS transistor of the unit delay circuit 335_2 is turned on during the first power gating operation. The second MOS transistor of the unit delay circuit 335_3 may be turned on when the first MOS transistor of the unit delay circuit 335_2 is turned on during the first power gating operation.

The unit delay circuit 335_4 may be coupled between the third power source line 337_1 and the second virtual ground line 337_4 and may delay the third bit IDLY3<3> of the third internal delay signal IDLY3<1:3> by the unit delay period to generate the first internal mode register strobe signal IMRR_STR<1>. One of the first and second MOS transistors included in the unit delay circuit 335_4 may be selectively turned on when the first power gating operation is performed. For example, when the first power gating operation is performed, the first MOS transistor of the unit delay circuit 335_4 may be coupled to the third power source line 337_1 to be turned on and the second MOS transistor of the unit delay circuit 335_4 may be coupled to the second virtual ground line 337_4 to be turned off. The first MOS transistor of the unit delay circuit 335_4 may be turned on when the second MOS transistor of the unit delay circuit 335_3 is turned on during the first power gating operation. The second MOS transistor of the unit delay circuit 335_4 may be turned on when the first MOS transistor of the unit delay circuit 335_3 is turned on during the first power gating operation.

The unit delay circuit 335_1 and the unit delay circuit 335_3 may receive the first ground voltage VSS from the third ground line 337_3 when the first power gating signal PG1 is enabled. The unit delay circuit 335_2 and the unit delay circuit 335_4 may receive the first power source voltage VDD from the third power source line 337_1 when the first power gating signal PG1 is enabled. That is, when the first power gating signal PG1 is enabled, the first power source voltage VDD may be supplied to some of the plurality of unit delay circuits 335_1, 335_2, 335_3, and 335_4 and the first ground voltage VSS may be supplied to the others of the plurality of unit delay circuits 335_1, 335_2, 335_3, and 335_4. Thus, the first mode register delay circuit 321 receiving power supply voltages with a zigzag power gating technique may cause the BTI phenomenon during a period the first power gating operation for interrupting the supply of the first power source voltage VDD and the first ground voltage VSS is performed. Accordingly, the first mode register delay circuit 321 may generate the first internal mode register strobe signal IMRR_STR<1>, a delay period of which is varied in proportion to a period that the first power gating operation is performed.

Figure 17:
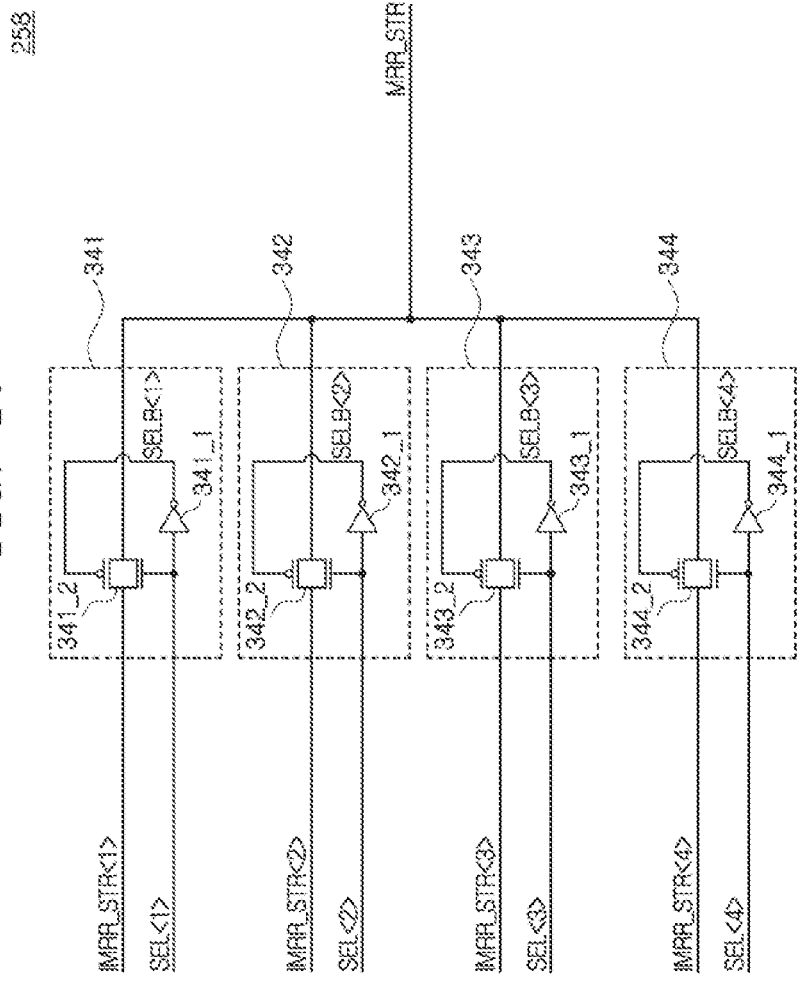
FIG. 17 is a circuit diagram illustrating a configuration of a first strobe signal output circuit included in the first strobe signal generation circuit illustrated in FIG. 7.

FIG. 17 is a circuit diagram illustrating a configuration of the first strobe signal output circuit 258 included in the first strobe signal generation circuit 209. As illustrated in FIG. 17, the first strobe signal output circuit 258 may include a first strobe signal selection circuit 341, a second strobe signal selection circuit 342, a third strobe signal selection circuit 343, and a fourth strobe signal selection circuit 344.

The first strobe signal selection circuit 341 may output the first internal mode register strobe signal IMRR_STR<1> as the mode register strobe signal MRR_STR when the first selection signal SEL<1> is enabled to have a logic "high" level. The first strobe signal selection circuit 341 may include an inverter 341_1 and a transfer gate 341_2. The inverter 341_1 may inversely buffer the first selection signal SEL<1> to generate a first inverted selection signal SELB<1>. The transfer gate 341_2 may output the first internal mode register strobe signal IMRR_STR<1> as the mode register strobe signal MRR_STR when the first selection signal SEL<1> is enabled to have a logic "high" level and the first inverted selection signal SELB<1> is disabled to have a logic "low" level.

The second strobe signal selection circuit 342 may output the second internal mode register strobe signal IMRR_STR<2> as the mode register strobe signal MRR_STR when the second selection signal SEL<2> is enabled to have a logic "high" level. The second strobe signal selection circuit 342 may include an inverter 342_1 and a transfer gate 342_2. The inverter 342_1 may inversely buffer the second selection signal SEL<2> to generate a second inverted selection signal SELB<2>. The transfer gate 342_2 may output the second internal mode register strobe signal IMRR_STR<2> as the mode register strobe signal MRR_STR when the second selection signal SEL<2> is enabled to have a logic "high" level and the second inverted selection signal SELB<2> is disabled to have a logic "low" level.

The third strobe signal selection circuit 343 may output the third internal mode register strobe signal IMRR_STR<3> as the mode register strobe signal MRR_STR when the third selection signal SEL<3> is enabled to have a logic "high" level. The third strobe signal selection circuit 343 may include an inverter 343_1 and a transfer gate 343_2. The inverter 343_1 may inversely buffer the third selection signal SEL<3> to generate a third inverted selection signal SELB<3>. The transfer gate 343_2 may output the third internal mode register strobe signal IMRR_STR<3> as the mode register strobe signal MRR_STR when the third selection signal SEL<3> is enabled to have a logic "high" level and the third inverted selection signal SELB<3> is disabled to have a logic "low" level.

The fourth strobe signal selection circuit 344 may output the fourth internal mode register strobe signal IMRR_STR<4> as the mode register strobe signal MRR_STR when the fourth selection signal SEL<4> is enabled to have a logic "high" level. The fourth strobe signal selection circuit 344 may include an inverter 344_1 and a transfer gate 344_2. The inverter 344_1 may inversely buffer the fourth selection signal SEL<4> to generate a fourth inverted selection signal SELB<4>. The transfer gate 344_2 may output the fourth internal mode register strobe signal IMRR_STR<4> as the mode register strobe signal MRR_STR when the fourth selection signal SEL<4> is enabled to have a logic "high" level and the fourth inverted selection signal SELB<4> is disabled to have a logic "low" level.

FIG. 18 is a block diagram illustrating a configuration of the second strobe signal generation circuit 211 included in the electronic device 120. As illustrated in FIG. 18, the second strobe signal generation circuit 211 may include a second timing detection circuit 351 and a second timing adjustment circuit 353.

The second timing detection circuit 351 may include a second variable delay command generation circuit (RD_VD_GEN) 354, a second fixed delay command generation circuit (RD_FD_GEN) 355, and a second selection signal generation circuit (SEL_GEN) 356. The second variable delay command generation circuit 354, the second fixed delay command generation circuit 355, and the second selection signal generation circuit 356 may have substantially the same configuration as respective ones of the first variable delay command generation circuit 254, the first fixed delay command generation circuit 255, and the first selection signal generation circuit 256 described with reference to FIG. 7. Thus, descriptions for configurations and operations of the second variable delay command generation circuit 354, the second fixed delay command generation circuit 355, and the second selection signal generation circuit 356 will be omitted hereinafter.

The second timing adjustment circuit 353 may include a read delay circuit 357 and a second strobe signal output circuit 358. The read delay circuit 357 and the second strobe signal output circuit 358 may have substantially the same configuration as respective ones of the mode register delay circuit 257 and the first strobe signal output circuit 258 described with reference to FIG. 7. Thus, descriptions for configurations and operations of the read delay circuit 357 and the second strobe signal output circuit 358 will be omitted hereinafter.

Figure 19:
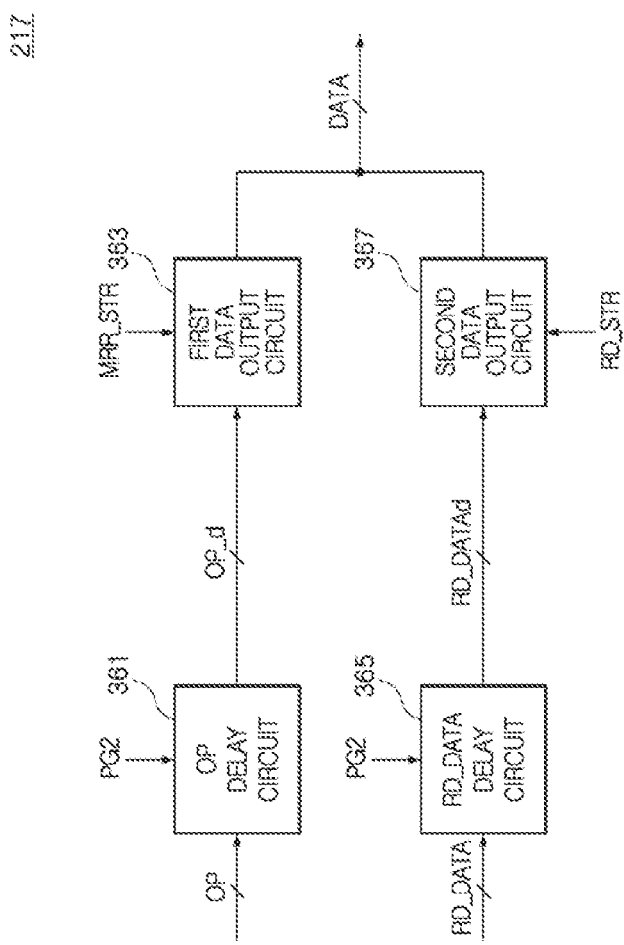
FIG. 19 is a block diagram illustrating a configuration of a data output control circuit included in the electronic device illustrated in FIG. 2.

FIG. 19 is a block diagram illustrating a configuration of the data output control circuit 217 included in the electronic device 120. As illustrated in FIG. 19, the data output control circuit 217 may include an operation code delay circuit 361, a first data output circuit 363, a read data delay circuit 365, and a second data output circuit 367.

The operation code delay circuit 361 may delay the operation code OP by the second predetermined delay period based on the second power gating signal PG2 to generate the delayed operation code OP_d. The operation code delay circuit 361 may generate the delayed operation code OP_d, a delay period of which is fixed, based on the second power gating signal PG2 which is enabled to perform the second power gating operation. The delay period of the delayed operation code OP_d may be fixed regardless of a period that the second power gating operation is performed. The number of bits included in the delayed operation code OP_d may be set to be different according to the embodiments. A configuration and an operation of the operation code delay circuit 361 will be described with reference to FIG. 20 later.

The first data output circuit 363 may output the delayed operation code OP_d as the data DATA in synchronization with the mode register strobe signal MRR_STR. The first data output circuit 363 may output the delayed operation code OP_d as the data DATA when the mode register strobe signal MRR_STR is enabled. A configuration and an operation of the first data output circuit 363 will be described with reference to FIG. 21 later.

The read data delay circuit 365 may delay the read data RD_DATA by the fourth predetermined delay period based on the second power gating signal PG2 to generate the delayed read data RD_DATAd. The read data delay circuit 365 may generate the delayed read data RD_DATAd, a delay period of which is fixed, based on the second power gating signal PG2 which is enabled to perform the second power gating operation. The delay period of the delayed read data RD_DATAd may be fixed regardless of a period that the second power gating operation is performed. The number of bits included in the delayed read data RD_DATAd may be set to be different according to the embodiments.

The second data output circuit 367 may output the delayed read data RD_DATAd as the data DATA in synchronization with the read strobe signal RD_STR. The second data output circuit 367 may output the delayed read data RD_DATAd as the data DATA when the read strobe signal RD_STR is enabled.

Figure 20:
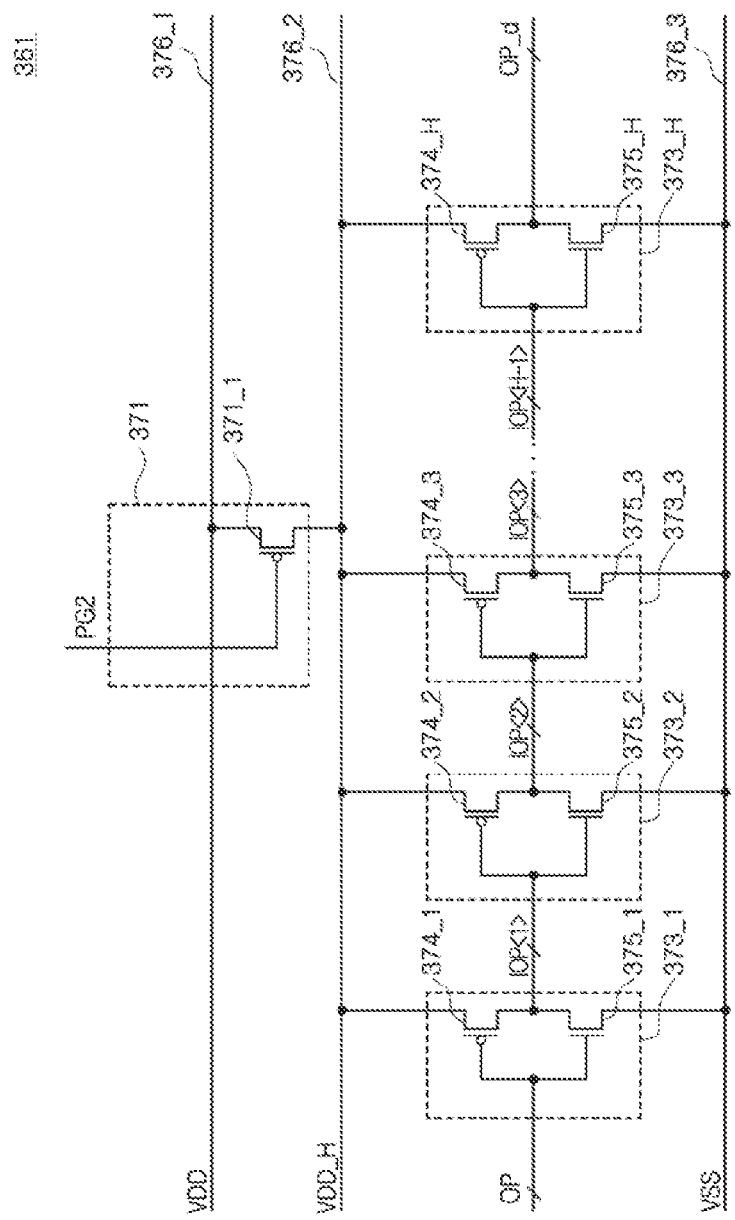
FIG. 20 is a circuit diagram illustrating a configuration of an operation code delay circuit included in the data output control circuit illustrated in FIG. 19.

FIG. 20 is a circuit diagram illustrating a configuration of the operation code delay circuit 361 included in the data output control circuit 217. As illustrated in FIG. 20, the operation code delay circuit 361 may include a fourth power gating circuit 371, a plurality of inverters 373_1~373_H, a fourth power source line 376_1, a fourth virtual power source line 376_2, and a fourth ground line 376_3.

The fourth power source line 376_1, the fourth virtual power source line 376_2, and the fourth ground line 376_3 may have substantially the same function as respective ones of the second power source line 285_1, the second virtual power source line 285_2, and the second ground line 285_3 described with reference to FIG. 10. Thus, the detailed descriptions of the fourth power source line 376_1, the fourth virtual power source line 376_2, and the fourth ground line 376_3 will be omitted hereinafter.

The fourth power gating circuit 371 may include a PMOS transistor 371_1. The fourth power gating circuit 371 may perform substantially the same operation as the second power gating circuit 281 described with reference to FIG. 10. Thus, the detailed description of the fourth power gating circuit 371 will be omitted hereinafter.

Each of the inverters 373_1~373_H may include a first MOS transistor and a second MOS transistor which are coupled in series (where, "H" may be set as a natural number which is equal to or greater than four). The first MOS transistor may be realized using a PMOS transistor, and the second MOS transistor may be realized using an NMOS transistor.

The inverter 373_1 may be coupled between the fourth virtual power source line 376_2 and the fourth ground line 376_3 and may inversely buffer the operation code OP to generate a first internal operation code IOP<1> which is delayed by a certain delay period as compared with the operation code OP. The inverter 373_1 may include a first MOS transistor 374_1 and a second MOS transistor 375_1, both of which are turned off when the second power gating operation is performed. For example, when the second power gating operation is performed, the first MOS transistor 374_1 of the inverter 373_1 may be coupled to the fourth virtual power source line 376_2 to be turned off and the second MOS transistor 375_1 of the inverter 373_1 may be coupled to the fourth ground line 376_3 to be turned off.

The inverter 373_2 may be coupled between the fourth virtual power source line 376_2 and the fourth ground line 376_3 and may inversely buffer the first internal operation code IOP<1> to generate a second internal operation code IOP<2> which is delayed by a certain delay period as compared with the first internal operation code IOP<1>. The inverter 373_2 may include a first MOS transistor 374_2 and a second MOS transistor 375_2, both of which are turned off when the second power gating operation is performed. For example, when the second power gating operation is performed, the first MOS transistor 374_2 of the inverter 373_2 may be coupled to the fourth virtual power source line 375_2 to be turned off and the second MOS transistor 375_2 of the inverter 373_2 may be coupled to the fourth ground line 376_3 to be turned off.

The inverter 373_3 may be coupled between the fourth virtual power source line 376_2 and the fourth ground line 376_3 and may inversely buffer the second internal operation code IOP<2> to generate a third internal operation code IOP<3> which is delayed by a certain delay period as compared with the second internal operation code IOP<2>. The inverter 373_3 may include a first MOS transistor 374_3 and a second MOS transistor 375_3, both of which are turned off when the second power gating operation is performed. For example, when the second power gating operation is performed, the first MOS transistor 374_3 of the inverter 373_3 may be coupled to the fourth virtual power source line 375_2 to be turned off and the second MOS transistor 375_3 of the inverter 373_3 may be coupled to the fourth ground line 376_3 to be turned off.

The inverter 373_H may be coupled between the fourth virtual power source line 376_2 and the fourth ground line 376_3 and may inversely buffer an (H−1)$^{th}$ internal operation code IOP<H−1> to generate the delayed operation code OP_d which is delayed by a certain delay period as compared with the (H−1)$^{th}$ internal operation code IOP<H−1>. The inverter 373_H may include a first MOS transistor 374_H and a second MOS transistor 375_H, both of which are turned off when the second power gating operation is performed. For example, when the second power gating operation is performed, the first MOS transistor 374_H of the inverter 373_H may be coupled to the fourth virtual power source line 376_2 to be turned off and the second MOS transistor 375_H of the inverter 373_H may be coupled to the fourth ground line 376_3 to be turned off.

The inverters 373_1~373_H may be coupled in parallel between the fourth virtual power source line 376_2 and the fourth ground line 376_3. When the second power gating signal PG2 is enabled to perform the second power gating operation, the fourth power gating circuit 371 may be turned off to interrupt the supply of the first power source voltage VDD from the fourth power source line 376_1 to the fourth virtual power source line 376_2. That is, when the second power gating operation is performed, the fourth virtual power source line 376_2 may be electrically floated. Thus, the operation code delay circuit 361 receiving power supply voltages with the header-only power gating technique may suppress the BTI phenomenon during a period the second power gating operation for interrupting the supply of the first power source voltage VDD is performed. Accordingly, the operation code delay circuit 361 may generate the delayed operation code OP_d, a delay period of which is fixed regardless of a period time that the second power gating operation is performed.

Figure 21:
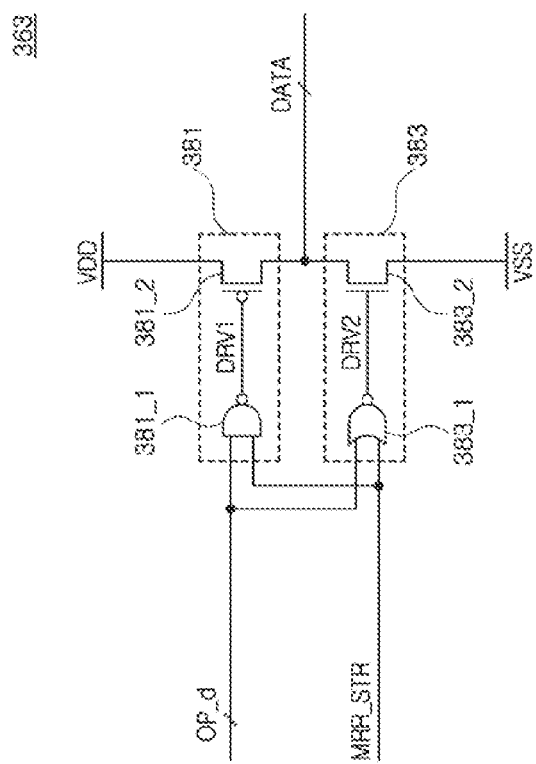
FIG. 21 is a circuit diagram illustrating a configuration of a first data output circuit included in the data output control circuit illustrated in FIG. 19.

FIG. 21 is a circuit diagram illustrating a configuration of the first data output circuit 363 included in the data output control circuit 217. As illustrated in FIG. 21, the first data output circuit 363 may include a first drive circuit 381 and a second drive circuit 383.

The first drive circuit 381 may pull up the data DATA to the first power source voltage VDD based on the delayed operation code OP_d and the mode register strobe signal MRR_STR. For example, the first drive circuit 381 may inversely buffer the delayed operation code OP_d to generate and output a first drive signal DRV1 when the mode register strobe signal MRR_STR is enabled to have a logic "high" level. The first drive circuit 381 may pull up the data DATA to the first power source voltage VDD when the first drive signal DRV1 has a logic "low" level. The first drive circuit 381 may include a NAND gate 381_1 and a PMOS transistor 381_2. The NAND gate 381_1 may inversely buffer the delayed operation code OP_d to generate and output the first drive signal DRV1 when the mode register strobe signal MRR_STR is enabled to have a logic "high" level. The PMOS transistor 381_2 may pull up the data DATA to the first power source voltage VDD when the first drive signal DRV1 has a logic "low" level.

The second drive circuit 383 may pull down the data DATA to the first ground voltage VSS based on the delayed operation code OP_d and the mode register strobe signal MRR_STR. The second drive circuit 383 may inversely buffer the delayed operation code OP_d to generate and output a second drive signal DRV2 when the mode register strobe signal MRR_STR is disabled to have a logic "low" level. The second drive circuit 383 may pull down the data DATA to the first ground voltage VSS when the second drive signal DRV2 has a logic "high" level. The second drive circuit 383 may include a NOR gate 383_1 and an NMOS transistor 383_2. The NOR gate 383_1 may inversely buffer the delayed operation code OP_d to generate and output the second drive signal DRV2 when the mode register strobe signal MRR_STR is disabled to have a logic "low" level. The NMOS transistor 383_2 may pull up the data DATA to the first ground voltage VSS when the second drive signal DRV2 has a logic "high" level.

Figure 22:
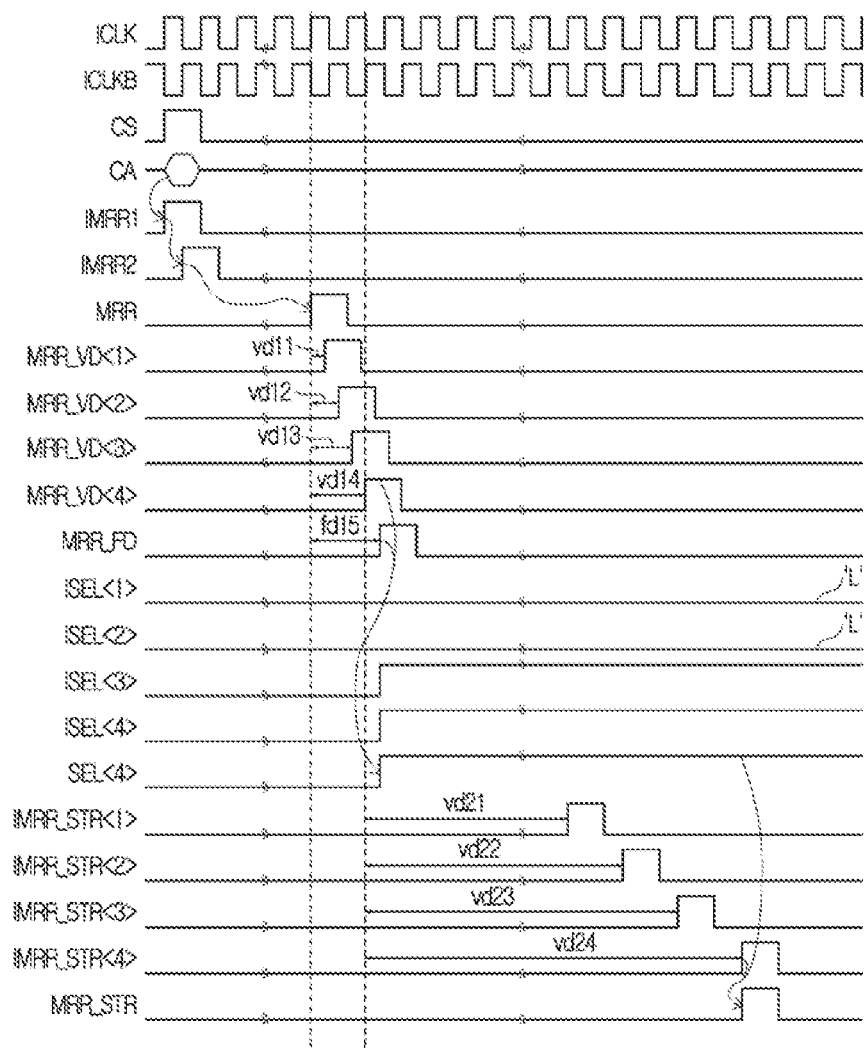
FIGS. 22 and 23 are timing diagrams illustrating a mode register read operation performed by the electronic device illustrated in FIG. 2.
Figure 23:
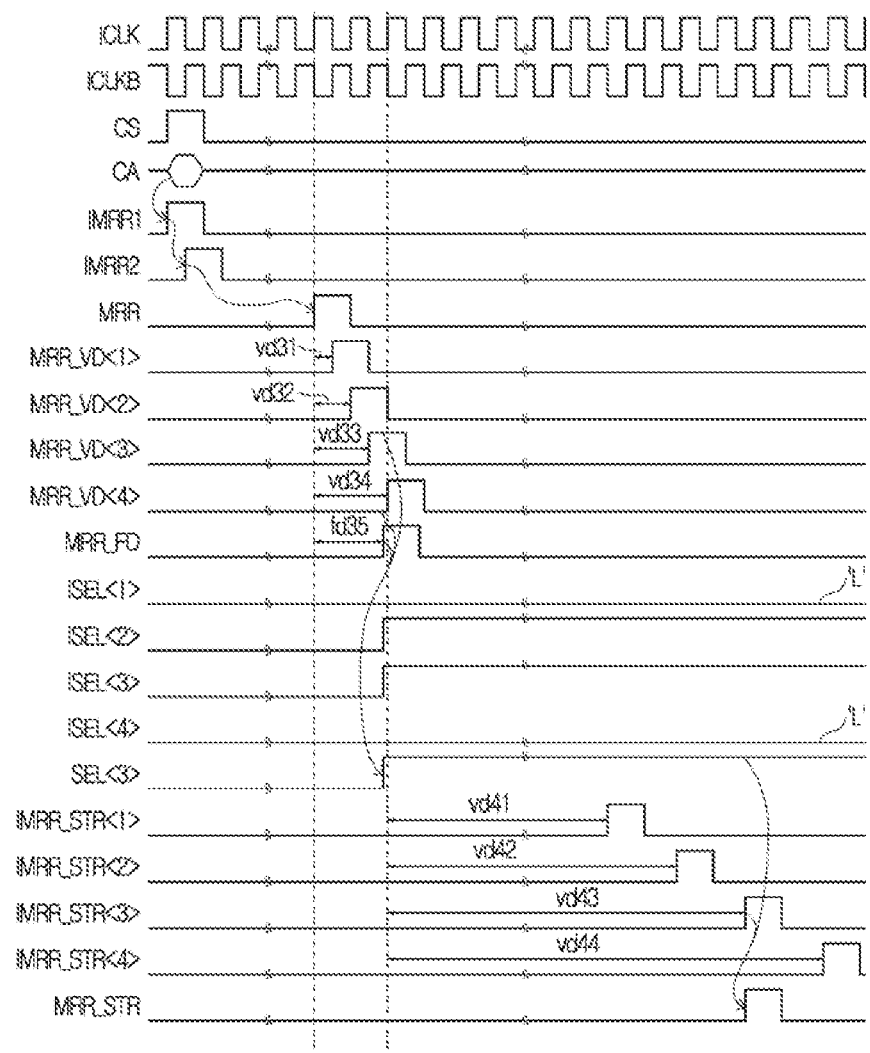

FIGS. 22 and 23 are timing diagrams illustrating the mode register read operation performed by the electronic device 120 illustrated in FIG. 2.

FIG. 22 is a timing diagram for illustrating the mode register read operation performed by the electronic device 120 in conjunction with a case that degradation of some MOS transistors in the electronic device 120 due to the BTI phenomenon is suppressed. The internal clock generation circuit 201 may generate the internal clock signal ICLK and the inverted internal clock signal ICLKB based on the dock signal CLK.

The command generation circuit 203 may be synchronized with the internal dock signal ICLK to generate the first internal mode register command (IMRR1 of FIG. 4) based on the chip selection signal CS and the command/address signal CA for performing the mode register read operation. The command generation circuit 203 may be synchronized with the inverted internal clock signal ICLKB to generate the second internal mode register command (IMRR2 of FIG. 4) from the first internal mode register command (IMRR1 of FIG. 4). The command generation circuit 203 may delay the second internal mode register command (IMRR2 of FIG. 4) by a certain delay period to generate the mode register command MRR.

The first variable delay command generation circuit (254 of FIG. 7) may delay the mode register command MRR to sequentially generate the first, second, third, and fourth variable delay mode register commands MRR_VD<1:4>. The first variable delay mode register command MRR_VD<1> may be generated by delaying the mode register command MRR by a period "vd11". The second variable delay mode register command MRR_VD<2> may be generated by delaying the mode register command MRR by a period "vd12". The third variable delay mode register command MRR_VD<3> may be generated by delaying the mode register command MRR by a period "vd13". The fourth variable delay mode register command MRR_VD<4> may be generated by delaying the mode register command MRR by a period "vd14".

The first fixed delay command generation circuit (255 of FIG. 7) may delay the mode register command MRR by a period "fd15" to generate the fixed delay mode register command MRR_FD.

The first selection signal generation circuit (256 of FIG. 7) may latch the first variable delay mode register command MRR_VD<1> to generate the first internal selection signal (ISEL<1> of FIG. 11), which is disabled to have a logic "low(L)" level, when the fixed delay mode register command MRR_FD is enabled to have a logic "high" level. The first selection signal generation circuit (256 of FIG. 7) may latch the second variable delay mode register command MRR_VD<2> to generate the second internal selection signal (ISEL<2> of FIG. 11), which is disabled to have a logic "low(L)" level, when the fixed delay mode register command MRR_FD is enabled to have a logic "high" level. The first selection signal generation circuit (256 of FIG. 7) may latch the third variable delay mode register command MRR_VD<3> to generate the third internal selection signal (ISEL<3> of FIG. 11), which is enabled to have a logic "high(H)" level, when the fixed delay mode register command MRR_FD is enabled to have a logic "high" level. The first selection signal generation circuit (256 of FIG. 7) may latch the fourth variable delay mode register command MRR_VD<4> to generate the fourth internal selection signal (ISEL<4> of FIG. 11), which is enabled to have a logic "high(H)" level, when the fixed delay mode register command MRR_FD is enabled to have a logic "high" level. The first selection signal generation circuit (256 of FIG. 7) may generate the fourth selection signal (SEL<4> of FIG. 7), which is enabled to have a logic "high" level, based on the fourth variable delay mode register command MRR_VD<4> and the fourth internal selection signal (ISEL<4> of FIG. 11) when the fixed delay mode register command MRR_FD is enabled to have a logic "high" level.

The mode register delay circuit (257 of FIG. 7) may delay the fourth variable delay mode register command MRR_VD<4> to sequentially generate the first, second, third, and fourth internal mode register strobe signals IMRR_STR<1:4>. The first internal mode register strobe signal IMRR_STR<1> may be generated by delaying the fourth variable delay mode register command MRR_VD<4> by a period "vd21" corresponding to the first internal predetermined delay period. The second internal mode register strobe signal IMRR_STR<2> may be generated by delaying the fourth variable delay mode register command MRR_VD<4> by a period "vd22" corresponding to the second internal predetermined delay period. The third internal mode register strobe signal IMRR_STR<3> may be generated by delaying the fourth variable delay mode register command MRR_VD<4> by a period "vd23" corresponding to the third internal predetermined delay period. The fourth internal mode register strobe signal IMRR_STR<4> may be generated by delaying the fourth variable delay mode register command MRR_VD<4> by a period "vd24" corresponding to the fourth internal predetermined delay period.

The first strobe signal output circuit 258 may output the fourth internal mode register strobe signal IMRR_STR<4> as the mode register strobe signal MRR_STR based on the fourth selection signal SEL<4> which is enabled.

FIG. 23 is a timing diagram for illustrating the mode register read operation performed by the electronic device 120 in conjunction with a case that some MOS transistors in the electronic device 120 are degraded due to the BTI phenomenon. The internal clock generation circuit 201 may generate the internal clock signal ICLK and the inverted internal clock signal ICLKB based on the clock signal CLK.

The command generation circuit 203 may be synchronized with the internal clock signal ICLK to generate the first internal mode register command (IMRR1 of FIG. 4) based on the chip selection signal CS and the command/address signal CA for performing the mode register read operation. The command generation circuit 203 may be synchronized with the inverted internal clock signal ICLKB to generate the second internal mode register command (IMRR2 of FIG. 4) from the first internal mode register command (IMRR1 of FIG. 4). The command generation circuit 203 may delay the second internal mode register command (IMRR2 of FIG. 4) by a certain delay period to generate the mode register command MRR.

The first variable delay command generation circuit (254 of FIG. 7) may delay the mode register command MRR to sequentially generate the first, second, third, and fourth variable delay mode register commands MRR_VD<1:4>. The first variable delay mode register command MRR_VD<1> may be generated by delaying the mode register command MRR by a period "vd31" which is greater than the period "vd11" illustrated in FIG. 22. The second variable delay mode register command MRR_VD<2> may be generated by delaying the mode register command MRR by a period "vd32" which is greater than the period "vd12" illustrated in FIG. 22. The third variable delay mode register command MRR_FD<3> may be generated by delaying the mode register command MRR by a period "vd33" which is greater than the period "vd13" illustrated in FIG. 22. The fourth variable delay mode register command MRR_VD<4> may be generated by delaying the mode register command MRR by a period "vd34" which is greater than the period "vd14" illustrated in FIG. 22.

The first fixed delay command generation circuit (255 of FIG. 7) may delay the mode register command MRR by a period "fd35" (equal to the period "fd15" illustrated in FIG. 22) to generate the fixed delay mode register command MRR_FD.

The first selection signal generation circuit (256 of FIG. 7) may latch the first variable delay mode register command MRR_VD<1> to generate the first internal selection signal (ISEL<1> of FIG. 11), which is disabled to have a logic "low(L)" level, when the fixed delay mode register command MRR_FD is enabled to have a logic "high" level. The first selection signal generation circuit (256 of FIG. 7) may latch the second variable delay mode register command MRR_VD<2> to generate the second internal selection signal (ISEL<2> of FIG. 11), which is enabled to have a logic "high(H)" level, when the fixed delay mode register command MRR_FD is enabled to have a logic "high" level. The first selection signal generation circuit (256 of FIG. 7) may latch the third variable delay mode register command MRR_VD<3> to generate the third internal selection signal (ISEL<3> of FIG. 11), which is enabled to have a logic "high(H)" level, when the fixed delay mode register command MRR_FD is enabled to have a logic "high" level. The first selection signal generation circuit (256 of FIG. 7) may latch the fourth variable delay mode register command MRR_VD<4> to generate the fourth internal selection signal (ISEL<4> of FIG. 11), which is disabled to have a logic "low(L)" level, when the fixed delay mode register command MRR_FD is enabled to have a logic "high" level. The first selection signal generation circuit (256 of FIG. 7) may generate the third selection signal (SEL<3> of FIG. 7), which is enabled to have a logic "high" level, based on the third variable delay mode register command MRR_VD< the fourth variable delay mode register command MRR_VD<4>, and the fourth internal selection signal (ISEL<4> of FIG. 11) when the fixed delay mode register command MRR_FD is enabled to have a logic "high" level.

The mode register delay circuit (257 of FIG. 7) may delay the fourth variable delay mode register command MRR_VD<4> to sequentially generate the first, second, third, and fourth internal mode register strobe signals IMRR_STR<1:4>. The first internal mode register strobe signal IMRR_STR<1> may be generated by delaying the fourth variable delay mode register command MRR_VD<4> by a period "vd41" (corresponding to the first internal predetermined delay period) which is greater than the period "vd21" illustrated in FIG. 22. The second internal mode register strobe signal IMRR_STR<2> may be generated by delaying the fourth variable delay mode register command MRR_VD<4> by a period "vd42" (corresponding to the second internal predetermined delay period) which is greater than the period "vd22" illustrated in FIG. 22. The third internal mode register strobe signal IMRR_STR<3> may be generated by delaying the fourth variable delay mode register command MRR_VD<4> by a period "vd43" (corresponding to the third internal predetermined delay period) which is greater than the period "vd23" illustrated in FIG. 22. The fourth internal mode register strobe signal IMRR_STR<4> may be generated by delaying the fourth variable delay mode register command MRR_VD<4> by a period "vd44" (corresponding to the fourth internal predetermined delay period) which is greater than the period "vd24" illustrated in FIG. 22.

The first strobe signal output circuit 258 may output the third internal mode register strobe signal IMRR_STR<3> as the mode register strobe signal MRR_STR based on the third selection signal SEL<3> which is enabled.

As described above, the electronic device 120 according to the present embodiment may delay the mode register command MRR by a first predetermined delay period to generate the mode register strobe signal MRR_STR when the mode register read operation is performed. In such a case, the electronic device 120 may detect variation of timing of the variable delay mode register command (MRR_VD of FIG. 7) to adjust the timing of the mode register strobe signal MRR_STR. Accordingly, it may be possible to compensate for a delay period, which is varied by the BTI phenomenon, in real time whenever the mode register read operation is performed.

Figure 24:
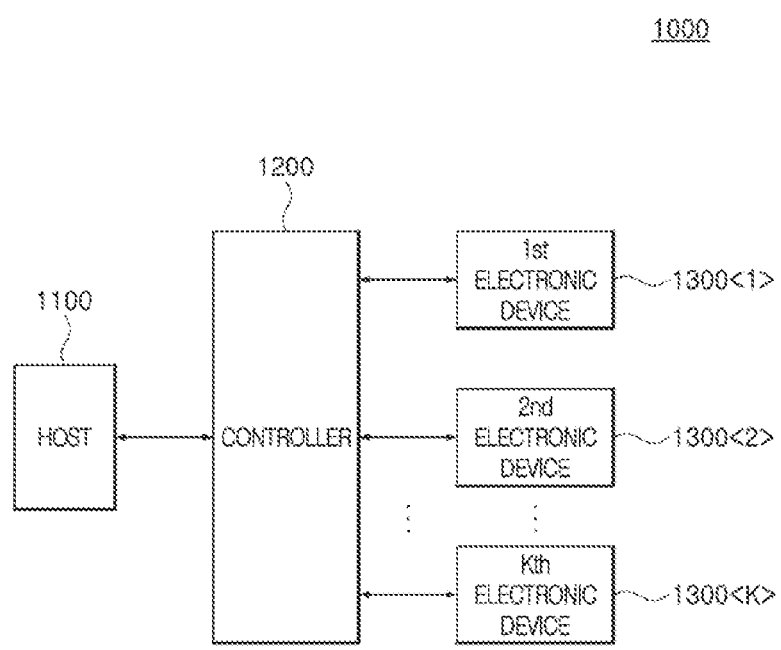
FIG. 24 is a block diagram illustrating a configuration of an electronic system according to another embodiment of the present disclosure.

FIG. 24 is a block diagram illustrating a configuration of an electronic system 1000 according to an embodiment of the present disclosure. As illustrated in FIG. 24, the electronic system 1000 may include a host 1100, a controller 1200, and first to $K^{th}$ electronic devices 1300<1:K> (where, "K" is a natural number which is equal to or greater than three). The controller 1200 may be realized using the controller 110 illustrated in FIG. 1. Each of the first to $K^{th}$ electronic devices 1300<1:K> may be realized using the electronic device 120 illustrated in FIG. 1.

The host 1100 and the controller 1200 may transmit signals to each other using an interface protocol. The interface protocol used for communication between the host 1100 and the controller 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The controller 1200 may control the first to $K^{th}$ electronic devices 1300<1:K> such that each of the first to $K^{th}$ electronic devices 1300<1:K> performs various internal operations including a read operation and a mode register read operation.

Each of the first to $K^{th}$ electronic devices 1300<1:K> may delay the mode register command (MRR of FIG. 2) by a first predetermined delay period to generate the mode register strobe signal (MRR_STR of FIG. 2) when the mode register read operation is performed. In such a case, each of the first to $K^{th}$ electronic devices 1300<1:K> may detect variation of timing of the variable delay mode register command (MRR_VD of FIG. 7) to adjust the timing of the mode register strobe signal (MRR_STR of FIG. 2). Accordingly, it may be possible to compensate for a delay period, which is varied by the BTI phenomenon, in real time whenever the mode register read operation is performed.

Each of the first to $K^{th}$ electronic devices 1300<1:K> may delay the read command (RD of FIG. 2) to generate the read strobe signal (RD_STR of FIG. 2) when the read operation is performed. In such a case, each of the first to $K^{th}$ electronic devices 1300<1:K> may detect variation of timing of the variable delay read command (RD_VD of FIG. 18) to adjust the timing of the read strobe signal (RD_STR of FIG. 2). Accordingly, it may be possible to compensate for a delay period, which is varied by the BTI phenomenon, in real time whenever the read operation is performed.

In some embodiments, each of the first to $K^{th}$ electronic devices 1300<1:K> may be realized using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. An electronic device comprising:
   a strobe signal generation circuit configured to delay a mode register command by a first predetermined delay period to generate a mode register strobe signal during a mode register read operation and configured to adjust a timing of the mode register strobe signal by detecting variation of timings of first and second variable delay mode register commands generated based on the mode register command during the mode register read operation; and
   a data output control circuit configured to delay an operation code which is generated based on the mode register command, by a second predetermined delay period to generate a delayed operation code and configured to output the delayed operation code as data in synchronization with the mode register strobe signal.

2. The electronic device of claim 1,
wherein the first predetermined delay period increases in proportion to a period that a first power gating operation for interrupting supply of a first power source voltage and a first ground voltage is performed; and
wherein the second predetermined delay period is fixed regardless of a period that a second power gating operation for interrupting supply of the first power source voltage is performed.

3. The electronic device of claim 1, wherein the strobe signal generation circuit includes:
a timing detection circuit configured to delay the mode register command to generate the first and second variable delay mode register commands and a fixed delay mode register command and configured to compare delay periods of the first and second variable delay mode register commands with a delay period of the fixed delay mode register command to generate first and second selection signals; and
a timing adjustment circuit configured to delay the second variable delay mode register command to sequentially generate first and second internal mode register strobe signals and configured to output one of the first and second internal mode register strobe signals as the mode register strobe signal based on the first and second selection signals.

4. The electronic device of claim 3,
wherein the delay periods of the first and second variable delay mode register commands increase in proportion to a period that a first power gating operation for interrupting supply of a first power source voltage and a first ground voltage is performed; and
wherein the delay period of the fixed delay mode register command is fixed regardless of a period that a second power gating operation for interrupting supply of the first power source voltage is performed.

5. The electronic device of claim 3,
wherein enablement periods of the first and second variable delay mode register commands partially overlap with each other; and
wherein the fixed delay mode register command is enabled in a period that at least one of the first and second variable delay mode register commands is enabled.

6. The electronic device of claim 3,
wherein the timing detection circuit is configured to enable the first selection signal when the delay period of the first variable delay mode register command is less than the delay period of the fixed delay mode register command and the delay period of the second variable delay mode register command is equal to or greater than the delay period of the fixed delay mode register command; and
wherein the timing detection circuit is configured to enable the second selection signal when the delay period of the second variable delay mode register command is less than the delay period of the fixed delay mode register command.

7. The electronic device of claim 6, wherein the timing adjustment circuit includes:
a mode register delay circuit configured to delay the second variable delay mode register command by a first internal predetermined delay period based on a first power gating signal to generate the first internal mode register strobe signal and configured to delay the second variable delay mode register command by a second internal predetermined delay period based on the first power gating signal to generate the second internal mode register strobe signal; and
a strobe signal output circuit configured to output the first internal mode register strobe signal as the mode register strobe signal when the first selection signal is enabled and configured to output the second internal mode register strobe signal as the mode register strobe signal when the second selection signal is enabled.

8. The electronic device of claim 7,
wherein the first and second internal predetermined delay periods increase in proportion to a period that a first power gating operation for interrupting supply of a first power source voltage and a first ground voltage is performed;
wherein the first internal predetermined delay period is set as a period from a point in time when the second variable delay mode register command is inputted to the timing adjustment circuit until a point in time when the delayed operation code is generated, when the first selection signal is enabled; and
wherein the second internal predetermined delay period is set as a period from a point in time when the second variable delay mode register command is inputted to the timing adjustment circuit until a point in time when the delayed operation code is generated, when the second selection signal is enabled.

9. The electronic device of claim 3, wherein the timing detection circuit includes:
a variable delay command generation circuit configured to delay the mode register command based on a first power gating signal to sequentially generate the first and second variable delay mode register commands;
a fixed delay command generation circuit configured to delay the mode register command based on a second power gating signal to generate the fixed delay mode register command; and
a selection signal generation circuit configured to compare the delay periods of the first and second variable delay mode register commands with the delay period of the fixed delay mode register command to generate the first and second selection signals.

10. The electronic device of claim 9,
wherein the first power gating signal is enabled to perform a first power gating operation for interrupting supply of a first power source voltage and a first ground voltage; and
wherein the second power gating signal is enabled to perform a second power gating operation for interrupting supply of the first power source voltage.

11. The electronic device of claim 10, wherein the variable delay command generation circuit includes:
a first unit delay circuit including first and second MOS transistors coupled in series between a second power source voltage and the first ground voltage, one of which is selectively turned on when the first power gating operation is performed; and
a second unit delay circuit including first and second MOS transistors coupled in series between the first power source voltage and a second ground voltage,
wherein the first MOS transistor included in the second unit delay circuit is turned on when the second MOS transistor included in the first unit delay circuit is turned on during the first power gating operation, and
wherein the second MOS transistor included in the second unit delay circuit is turned on when the first MOS transistor included in the first unit delay circuit is turned on during the first power gating operation.

12. The electronic device of claim 10, wherein the fixed delay command generation circuit includes first and second MOS transistors coupled in series between a third power source voltage and the first ground voltage, both of which are turned off when the second power gating operation is performed.

13. The electronic device of claim 9, wherein the selection signal generation circuit includes:
 an internal selection signal generation circuit configured to latch the first variable delay mode register command to generate a first internal selection signal when the fixed delay mode register command is enabled and configured to latch the second variable delay mode register command to generate a second internal selection signal when the fixed delay mode register command is enabled; and
 an internal selection signal conversion circuit configured to enable the first selection signal when the first internal selection signal is enabled and the second internal selection signal is disabled and configured to enable the second selection signal when the second internal selection signal is enabled.

14. An electronic device comprising:
 a timing detection circuit configured to delay a mode register command for a mode register read operation based on first and second power gating signals to generate first and second variable delay mode register commands having variable delay periods and a fixed delay mode register command having a fixed delay period and configured to compare the variable delay periods of the first and second variable delay mode register commands with the fixed delay period of the fixed delay mode register command to generate first and second selection signals; and
 a timing adjustment circuit configured to delay the second variable delay mode register command based on the first and second selection signals to generate a mode register strobe signal for the mode register read operation.

15. The electronic device of claim 14,
 wherein the first power gating signal is enabled to perform a first power gating operation for interrupting supply of a first power source voltage and a first ground voltage; and
 wherein the second power gating signal is enabled to perform a second power gating operation for interrupting supply of the first power source voltage.

16. The electronic device of claim 14,
 wherein the variable delay periods of the first and second variable delay mode register commands increase in proportion to a period that a first power gating operation for interrupting supply of a first power source voltage and a first ground voltage is performed; and
 wherein the fixed delay period of the fixed delay mode register command is fixed regardless of a period that a second power gating operation for interrupting supply of the first power source voltage is performed.

17. The electronic device of claim 14, wherein the timing detection circuit includes:
 a variable delay command generation circuit configured to delay the mode register command based on the first power gating signal to sequentially generate the first and second variable delay mode register commands;
 a fixed delay command generation circuit configured to delay the mode register command based on the second power gating signal to generate the fixed delay mode register command; and
 a selection signal generation circuit configured to compare the variable delay periods of the first and second variable delay mode register commands with the fixed delay period of the fixed delay mode register command to generate the first and second selection signals.

18. The electronic device of claim 17, wherein the variable delay command generation circuit includes:
 a first power gating circuit configured to interrupt supply of a first power source voltage from a first power source line to a first virtual power source line when a first power gating operation is performed;
 a first ground gating circuit configured to interrupt supply of a first ground voltage from a first ground line to a first virtual ground line when the first power gating operation is performed;
 a first unit delay circuit including a first MOS transistor coupled to the first virtual power source line to be turned off and a second MOS transistor coupled to the first ground line to be turned on, when the first power gating operation is performed; and
 a second unit delay circuit including a first MOS transistor coupled to the first power source line to be turned on and a second MOS transistor coupled to the first virtual ground line to be turned off, when the first power gating operation is performed.

19. The electronic device of claim 17, wherein the fixed delay command generation circuit includes:
 a second power gating circuit configured to interrupt supply of a first power source voltage from a second power source line to a second virtual power source line when a second power gating operation is performed;
 a second ground line to which a first ground voltage is applied; and
 a third unit delay circuit including a first MOS transistor coupled to the second virtual power source line to be turned off and a second MOS transistor coupled to the second ground line to be turned off, when the second power gating operation is performed.

20. The electronic device of claim 14, wherein the timing adjustment circuit is configured to delay the second variable delay mode register command to sequentially generate first and second internal mode register strobe signals and is configured to output one of the first and second internal mode register strobe signals as the mode register strobe signal based on the first and second selection signals.

* * * * *